US007138658B2

(12) United States Patent
Yamazaki et al.

(10) Patent No.: US 7,138,658 B2
(45) Date of Patent: *Nov. 21, 2006

(54) SEMICONDUCTOR DEVICE AND METHOD OF MANUFACTURING THE SAME

(75) Inventors: Shunpei Yamazaki, Tokyo (JP); Hisashi Ohtani, Kanagawa (JP); Jun Koyama, Kanagawa (JP); Takeshi Fukunaga, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/081,564

(22) Filed: Mar. 17, 2005

(65) Prior Publication Data

US 2005/0194595 A1 Sep. 8, 2005

Related U.S. Application Data

(63) Continuation of application No. 10/024,850, filed on Dec. 18, 2001, which is a continuation of application No. 08/951,819, filed on Oct. 14, 1997, now Pat. No. 6,365,933.

(30) Foreign Application Priority Data

Oct. 15, 1996 (JP) .................................. 8-294419
Oct. 24, 1996 (JP) .................................. 8-301250

(51) Int. Cl.
*H01L 29/04* (2006.01)
(52) U.S. Cl. ............................. 257/72; 257/59; 257/66; 257/69
(58) Field of Classification Search ............... 257/350, 257/347, 72, 59, 66, 69
See application file for complete search history.

(56) References Cited

U.S. PATENT DOCUMENTS

| 5,529,937 A | 6/1996 | Zhang et al. |
| 5,534,716 A | 7/1996 | Takemura |
| 5,569,936 A | 10/1996 | Zhang et al. |
| 5,591,987 A | 1/1997 | Yamazaki et al. |
| 5,604,360 A | 2/1997 | Zhang et al. |
| 5,608,232 A | 3/1997 | Yamazaki et al. |
| 5,614,732 A | 3/1997 | Yamazaki |
| 5,616,506 A | 4/1997 | Takemura |
| 5,627,384 A | 5/1997 | Teramoto et al. |
| 5,639,698 A | 6/1997 | Yamazaki et al. |

(Continued)

FOREIGN PATENT DOCUMENTS

CN 1094851 A 11/1994

(Continued)

OTHER PUBLICATIONS

Decision of Rejection Issued by Japan Patent Office dated Jan. 25, 2005 w/English translation.

(Continued)

*Primary Examiner*—Hsien-Ming Lee
*Assistant Examiner*—Su C Kim
(74) *Attorney, Agent, or Firm*—Fish & Richardson P.C.

(57) ABSTRACT

A semiconductor device having performance comparable with a MOSFET is provided. An active layer of the semiconductor device is formed by a crystalline silicon film crystallized by using a metal element for promoting crystallization, and further by carrying out a heat treatment in an atmosphere containing a halogen element to carry out gettering of the metal element. The active layer after this process is constituted by an aggregation of a plurality of needle-shaped or column-shaped crystals. A semiconductor device manufactured by using this crystalline structure has extremely high performance.

10 Claims, 14 Drawing Sheets

U.S. PATENT DOCUMENTS

| | | |
|---|---|---|
| 5,646,424 A | 7/1997 | Zhang et al. |
| 5,663,077 A | 9/1997 | Adachi et al. |
| 5,677,549 A | 10/1997 | Takayama et al. |
| 5,696,386 A | 12/1997 | Yamazaki |
| 5,717,224 A | 2/1998 | Zhang |
| 5,763,899 A | 6/1998 | Yamazaki et al. |
| 5,814,540 A | 9/1998 | Takemura et al. |
| 5,821,138 A | 10/1998 | Yamazaki et al. |
| 5,821,563 A | 10/1998 | Yamazaki |
| 5,869,363 A | 2/1999 | Yamazaki et al. |
| 5,882,960 A | 3/1999 | Zhang et al. |
| 5,888,858 A | 3/1999 | Yamazaki et al. |
| 5,895,933 A | 4/1999 | Zhang et al. |
| 5,897,374 A | 4/1999 | Lin |
| 5,932,893 A | 8/1999 | Miyanaga et al. |
| 5,966,594 A | 10/1999 | Adachi et al. |
| 6,071,764 A | 6/2000 | Zhang et al. |
| 6,077,758 A | 6/2000 | Zhang et al. |
| 6,194,254 B1 | 2/2001 | Takemura |
| 6,207,969 B1 | 3/2001 | Yamazaki |
| 6,210,997 B1 | 4/2001 | Adachi et al. |
| 6,365,933 B1 | 4/2002 | Yamazaki et al. |
| 6,455,401 B1 | 9/2002 | Zhang et al. |
| 6,465,284 B1 | 10/2002 | Adachi et al. |
| 6,475,840 B1 | 11/2002 | Miyanaga et al. |
| 6,482,686 B1 | 11/2002 | Takemura |
| 6,875,628 B1 | 4/2005 | Zhang et al. |
| 2001/0019860 A1 | 9/2001 | Adachi et al. |
| 2003/0022467 A1 | 1/2003 | Zang et al. |
| 2003/0054595 A1 | 3/2003 | Takemura |

FOREIGN PATENT DOCUMENTS

| | | |
|---|---|---|
| EP | 0 631 325 A2 | 12/1994 |
| JP | 03-203322 | 9/1991 |
| JP | 06-349735 | 12/1994 |
| JP | 07-066425 | 3/1995 |
| JP | 07-066426 | 3/1995 |
| JP | 07-094757 | 4/1995 |
| JP | 07-183506 | 7/1995 |
| JP | 07-321327 | 12/1995 |
| JP | 07-321339 | 12/1995 |

OTHER PUBLICATIONS

Schoenfeld et al.; "Crystallization of Amorphous Silicon by $NiSi_2$ Precipitates", Thin Solid Films; pp. 236-240, No. 261 (1995).

HEAT TREATMENT FOR CRYSTALLIZATION

HEAT TREATMENT IN ATMOSPHERE CONTAINING HALOGEN ELEMENT

150μm

150μm

IMPURITY ION IMPLANTATION

IMPURITY ION IMPLANTATION

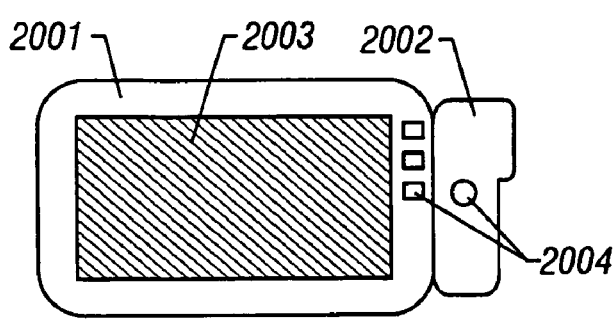
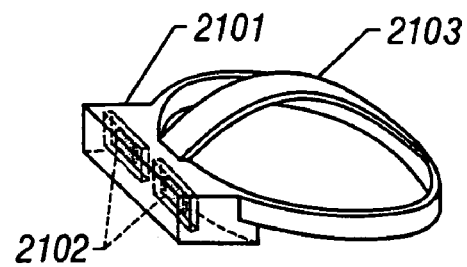
FIG. 16A
FIG. 16B
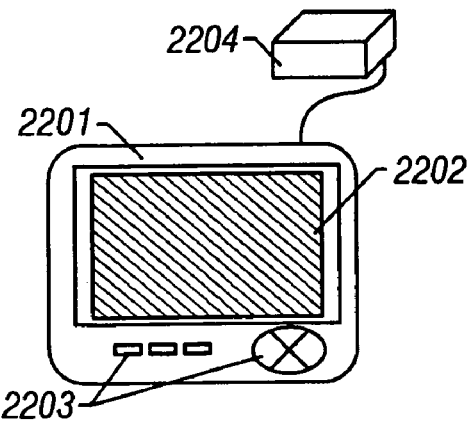
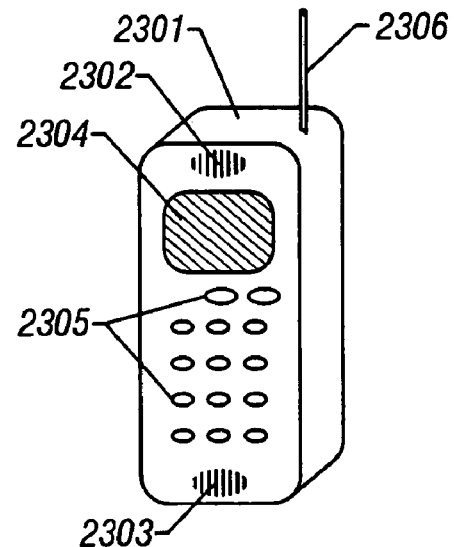
FIG. 16C
FIG. 16D
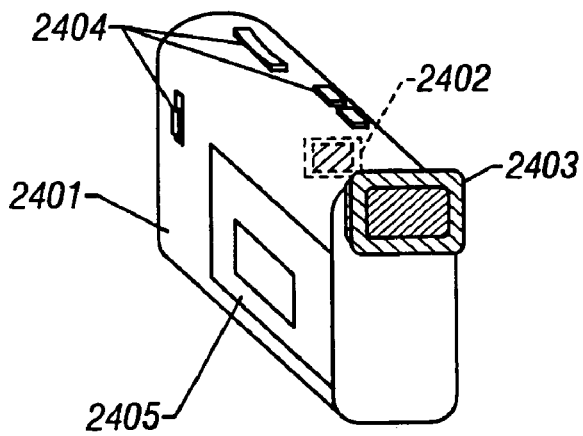
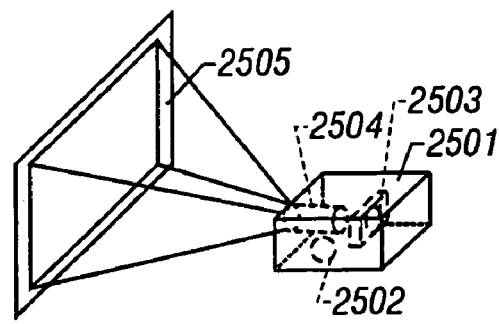
FIG. 16E
FIG. 16F

SEMICONDUCTOR DEVICE AND METHOD OF MANUFACTURING THE SAME

CROSS-REFERENCE TO RELATED APPLICATIONS

This application is a continuation application of U.S. application Ser. No. 10/024,850, filed Dec. 18, 2001, now allowed, which is a continuation of U.S. application Ser. No. 08/951,819, filed Oct. 14, 1997, now U.S. Pat. No. 6,365,933, which claims the benefit of foreign priority applications filed in Japan as Serial No. 08-301250 on Oct. 24, 1996 and as Serial No. 08-294419 on Oct. 15, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device having an active layer of a semiconductor thin film formed on a substrate having an insulating surface, and particularly to a thin film transistor in which an active layer is made of a crystalline silicon film.

2. Description of the Related Art

In recent years, attention has been paid to a technique in which a thin film transistor (TFT) is constituted by using a semiconductor thin film (thickness of about hundreds to thousands A) formed on a substrate having an insulating surface. The thin film transistor is widely applied to an electronic device such as an IC or an electro-optical device, and especially, its development as a switching element for an image display device has been hurried.

For example, in a liquid crystal display device, attempts have been made to apply TFTs to any electric circuit such as a pixel matrix circuit for respectively controlling pixel regions arranged in a matrix form, a drive circuit for controlling the pixel matrix circuit, and a logic circuit (processor circuit, memory circuit, etc.) for processing data signals from the outside.

In the present circumstances, although a TFT using an amorphous silicon film as an active layer is put into practical use, an electric circuit required to have further high speed operational performance, such as a drive circuit and a logic circuit, demands a TFT using a crystalline silicon film (polysilicon film).

As a method of forming a crystalline silicon film on a substrate, techniques disclosed in Japanese Patent Unexamined Publication No. Hei 6-232059 and No. Hei. 6-244103 by the present applicant are well known. The techniques disclosed in these-publications enable the formation of a crystalline silicon film having excellent crystallinity by using a metal element (especially nickel) for promoting crystallization of silicon and by a heat treatment at 500 to 600° C. for about four hours.

Japanese Patent Unexamined Publication No. Hei. 7-321339 discloses a technique for carrying out crystal growth substantially parallel to a substrate by utilizing the above techniques. The present inventors refer to the formed crystallized region as especially a side growth region (or lateral growth region).

However, even if a drive circuit is constituted by using such a TFT, the drive circuit is still far from the state of completely satisfying the required performance. In the present circumstances, especially it is impossible to constitute a high speed logic circuit requiring electric characteristics of extremely high performance to realize both high speed operation and high withstand voltage characteristics at the same time, by a conventional TFT.

As described above, in order to attain the higher performance of an electro-optical device and the like, it is necessary to realize a TFT having performance comparable wish a MOSFET formed by using a single crystal silicon wafer.

SUMMARY OF THE INVENTION

An object of the present invention is therefore to provide a thin film semiconductor device having extremely high performance as a breakthrough for realizing higher performance of an electro-optical device, and a method of manufacturing the same.

It is conceivable, as a reason why a high performance TFT as mentioned above has not been able to be obtained by a conventional method, that carriers (electrons or holes) are captured by crystal grain boundaries so that improvement of an field effect mobility as one of parameters showing TFT characteristics has been prevented.

For example, there are many unpaired bonds (dangling bonds) of silicon atoms and defect (capture) levels in the crystal grain boundaries. Accordingly, since carries moving in the inside of each crystal are easily trapped by the dangling bonds, defect levels or the like when they come close to or come into contact with the crystal grain boundaries, it is conceivable that the crystal grain boundaries have functioned as "malignant crystal grain boundaries" to block the movement of the carries.

In order to realize a semiconductor device of the present invention, it is indispensable to provide a technique to change the structure of such "malignant crystal grain boundaries" into "benign crystal grain boundaries" for carriers. That is, it is important to form crystal grain boundaries which have a low probability of capturing carriers, that is, a low possibility of blocking the movement of carries.

Therefore, according to the present invention disclosed in the present specification, a method of manufacturing a semiconductor device including an active layer of a semiconductor thin film, comprises the steps of forming an amorphous silicon film on a substrate having an insulating surface, forming a mask insulating film selectively on the amorphous silicon film, making the amorphous silicon film selectively hold a metal element for promoting crystallization, transforming at least a part of the amorphous silicon film into a crystalline silicon film by a first heat treatment, removing the mask insulating film, forming an active layer made of only the crystalline silicon film by patterning, forming a gate insulating film on the active layer, carrying out a second heat treatment in an atmosphere containing a halogen element so that the metal element in the active layer is removed through gettering and a thermal oxidation film is formed in an interface between the active layer and the gate insulating film, and carrying out a third heat treatment in a nitrogen atmosphere to improve film qualities of the gate insulating film including the thermal oxidation film and the state of the interface, wherein the active layer is a crystalline structure body in which crystal grain boundaries are aligned substantially in one direction and which is constituted by an aggregation of a plurality of needle-shaped or column-shaped crystals substantially parallel with the substrate.

If a crystalline silicon film is formed n accordance with the above manufacturing method, a thin film having an appearance as shown in FIG. 9 is obtained. FIG. 9 is an enlarged micrograph of the thin film in the case where the present invention was practiced by using the technique disclosed in Japanese Patent Unexamined Publication No. Hei. 7-321339 as means-for crystallizing an amorphous silicon film, and shows a lateral growth region 901 having a length of several tens to a hundred and several tens μm.

The lateral growth region 901 has a feature that since the needle-shaped or column-shaped crystals grow almost vertically to a region (designated by 902) in which a metal element for promoting the crystallization has been added, and substantially parallel with each other, the directions of crystals are aligned. A portion designated by 903 is a macroscopic crystal grain boundary (differentiated from crystal grain boundaries between needle-shaped crystal and column-shaped crystals) formed by collision between needle-shaped crystal and column-shaped crystals extending from the opposing added regions 902.

FIG. 10 is a TEM photograph in which a minute region of the inside of a crystalline grain is further enlarged with paying attention to the inside of the lateral growth region shown in FIG. 9.

That is, although the crystalline silicon film of the present invention seems to be macroscopically composed of the large lateral growth region 901 as shown in FIG. 9, when the lateral growth region 901 is microscopically observed, the lateral growth region is such a crystalline structure body as to be constituted by a plurality of needle-shaped or column-shaped crystals 1001 as shown in FIG. 10.

In FIG. 10, reference numeral 1002 denotes a crystal grain boundary showing a boundary between the needle-shaped or column-shaped crystals, and from the direction of extension of the crystal grain boundary 1002, it is confirmed that the needle-shaped or column-shaped crystals 1001 grew substantially parallel to each other. Incidentally, the crystal grain boundary in the present specification indicates a boundary between the needle-shaped or column-shaped crystals unless specified otherwise.

In the semiconductor device of the present invention, the metal element (mainly nickel) for promoting crystallization is removed through gettering by the heat treatment in the atmosphere containing a halogen element, so that the concentration of nickel, which has remained at a concentration of not less than $1 \times 10^{18}$ atoms/cm$^3$, is reduced to not larger than $1 \times 10^{18}$ atoms/cm$^3$, typically to $1 \times 10^{14}$–$5 \times 10^{17}$ atoms/cm$^3$ (preferably not larger than spin density in the active layer).

Of course, it is conceivable that other metal element (Cu, Al etc.) mixed by contamination or the like (not added intentionally) is similarly removed through gettering.

At this time, it is expected that dangling bonds of silicon atoms are combined with oxygen during the heat treatment to form oxide (silicon oxide). As a result, the silicon oxide is formed in the region of "malignant crystal grain boundaries", and it is conceivable that the silicon oxide substantially functions as crystal grain boundaries.

It is inferred that the crystal grain boundary 1002 formed in this way has a state in which lattice defects are hardly included in the interface between the silicon oxide and crystalline silicon so that the alignment is excellent. This is because silicon atoms between lattices which cause defects are consumed by the synergy effect of a process in which the silicon oxide is formed by thermal oxidation and a process in which recombination between silicon atoms themselves or silicon atoms and oxygen atoms is promoted by the catalysis of nickel.

That is, in FIG. 10, it is conceivable that the crystal grain boundary 1002 has little defects to capture carriers so that it behaves as "benign crystal grain boundary" which functions as only an energy barrier for carriers moving in the inside of the needle-shaped or column-shaped crystal.

Since thermal oxidation reaction proceeds with priority in such a crystal grain boundary, a thicker thermal oxidation film is formed in the crystal grain boundary than other regions. Thus, it is inferred that a gate voltage applied to the vicinity of the crystal grain boundary becomes apparently small, which also can become an energy barrier.

Further, since this heat treatment is carried out at a relatively high temperature exceeding 700° C. (typically 800–1100° C.), crystal defects such as dislocation or stacking fault existing in the inside of the needle-shaped or column-shaped crystal are almost vanished. Furthermore, the remaining dangling bonds of silicon atoms are terminated by hydrogen or a halogen element contained in the film.

Accordingly, the present inventors define, in the state obtained in this way and shown in FIG. 10, the region of the inside of the plurality of needle-shaped or column-shaped crystals as "region considered to be substantially single crystal for carriers".

The feature "considered to be substantially single crystal for carriers" means that there is no barrier to block the movement of carriers when the carriers move. In other words, there are no crystal defects and no grain boundaries, or no potential barriers as energy barriers.

The present invention provides a semiconductor device with high performance which can constitute a drive circuit or a logic circuit by using a crystalline silicon film having the structure as described above so as to form an active layer of the semiconductor device typified by a TFT.

BRIEF DESCRIPTION OF THE DRAWINGS

FIGS. 16A to 16F are views showing application examples of a semiconductor device.

DETAILED DESCRIPTION OF THE INVENTION

The present invention will be explained in detail on the basis of preferred embodiments described below.

[First Embodiment]

In this embodiment, there is described an example where a crystalline silicon film formed in accordance with a manufacturing method of the present invention is used as an active layer of a thin film transistor (TFT). FIGS. 1A to 1D show part of manufacturing steps of the TFT.

Incidentally, means for crystallizing an amorphous silicon film used in this embodiment is a technique disclosed in Japanese Patent Unexamined Publication No. Hei. 7-321339. Accordingly, in this embodiment, since only a brief description thereof will be disclosed, please refer to the publication for details.

First, a substrate 101 having an insulating surface is prepared. In this embodiment, a silicon oxide film 102 with a thickness of 2000 Å as an under layer is formed on a quartz substrate. A method of forming the silicon oxide film 102 includes a low pressure thermal CVD method, a plasma CVD method, a sputtering method and the like.

According to research of the present inventors, it has been found that the crystallinity of an obtained crystalline silicon film is superior if the under layer is dense when an amorphous silicon film is crystallized later. It is preferable that the film contains oxygen of $5 \times 10^{17}$ to $2 \times 10^{19}$ atoms/cm$^3$. The oxygen contained in the film plays an important role at the later gettering process of a metal element for promoting crystallization.

Next, an amorphous silicon film 103 with a thickness of 200 to 1000 Å (350 Å in this embodiment) is formed by the low pressure thermal CVD method. Silane-based gas ($SiH_4$, $Si_2H_6$, $Si_3H_8$ and the like) may be used as film forming gas. The amorphous silicon film formed by the low pressure thermal. CVD method has a small incidence of natural nucleus at the subsequent crystallization. This decreases the rate of mutual interference of the respective crystals (growth is stopped due to collision), so that it is preferable in enlargement of a lateral growth width.

Of course, the plasma CVD method, sputtering method, or the like may be used as a method of forming the amorphous silicon film 103.

Next, a silicon oxide film 104 with a thickness of 500 to 1200 Å is formed by the plasma CVD method or sputtering method, and then only regions of the silicon oxide film into which a metal element for promoting crystallization is to be introduced later, are selectively removed by etching. That is, this silicon oxide film 104 functions as a mask insulating film for selectively introducing nickel into the amorphous silicon film 103.

Figure 1A:
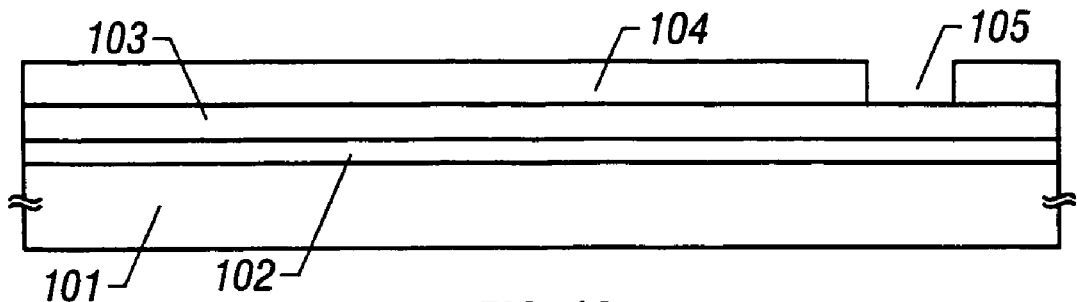
FIGS. 1A to 1D are views showing manufacturing steps of a semiconductor device.

A region 105 exposed by the silicon oxide film 104 is formed into a slit shape having a longitudinal direction in the direction vertical to a paper surface (FIG. 1A).

Next, UV light is radiated in an oxygen atmosphere so that a very thin oxide film (not shown) is formed on the surface of the amorphous silicon film 103 exposed on the region 105. This oxide film serves to improve wettability of a solution at a solution applying step when a metal element for promoting crystallization is later introduced.

The metal element for promoting crystallization is one kind of or plural kinds of elements selected from Fe, Co, Ni, Ru, Rh, Pd, Os, Ir, Pt, Cu and Au. In this embodiment, an example using Ni (nickel) will be described.

Figure 1B:
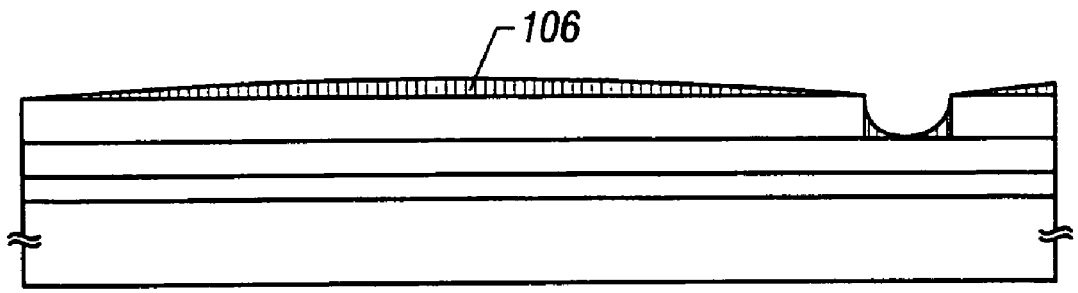

Next, a nickel nitrate solution (or nickel acetate solution) containing nickel of a predetermined concentration (100 ppm in weight in this embodiment) is dropped, and a thin water film 106 containing nickel is formed by a spin coating method. It is possible to easily control the concentration of nickel added into the amorphous silicon film by adjusting the concentration of the nickel salt solution in the solution applying step (FIG. 1B).

Figure 1C:
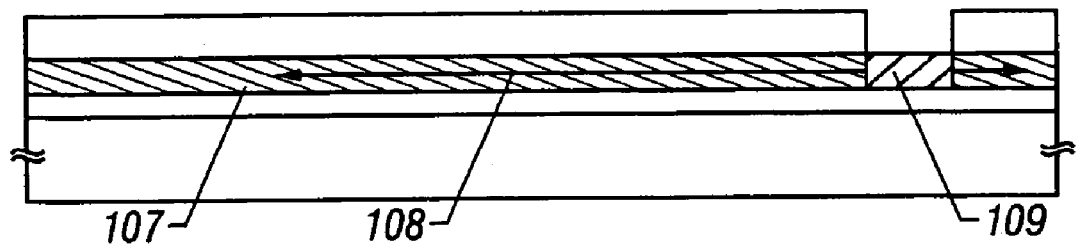

Next, after extraction of hydrogen in an inert gas atmosphere at 450° C. for about one hour is carried out, a heat treatment (first heat treatment) at 500 to 700° C., typically 550 to 600° C. for 4 to 8 hours is carried out to crystallize the amorphous silicon film 103. In this way, a crystalline silicon film 107 is obtained (FIG. 1C).

At this time, crystal growth proceeds so that needle-shaped or column-shaped crystals extend in substantially parallel to the substrate. In this embodiment, since the region 105 is the slit shape having the longitudinal direction from this side to back side of the drawing, the crystal growth proceeds toward substantially one direction as shown by an arrow 108. At this time, the crystal growth can be made over the length of several hundred µm or more.

Reference numeral 109 denotes a nickel added region which contains nickel of higher concentration than the lateral growth region 107. Since the crystal growth proceeds under the condition that crystal nuclei excessively close up in she added region 109, the crystallinity is not very good. Thus, an active layer subsequently formed will be constituted by regions except the added region 109.

Next, after the heat treatment for crystallization is ended, the silicon oxide film 104 as the mask insulating film for selectively adding the nickel is removed. This step is easily carried out by buffered hydrofluoric acid or the like.

Laser annealing by an excimer laser may be applied to the crystalline silicon film 107 before and/or after a subsequent heat treatment in an atmosphere containing a halogen element. However, although the crystallinity of the crystalline silicon film can be improved by the laser irradiation, roughness is apt to be formed on the surface of the silicon film, so that care must be paid.

Next, the thus obtained crystalline silicon film 107 is patterned to form an active layer 110 subsequently functioning as an active layer of a TFT. In the present invention, the arrangement of the active layer is important. That will be described later.

After formation of the active layer 110, a gate insulating film 111 with a thickness of 200 to 1500 Å (300 Å in this embodiment) made of a silicon oxide film is formed on the active layer 110. A method of forming the gate insulating Film 111 includes a vapor phase method such as a plasma CVD method, a thermal CVD method, and a sputtering method.

A silicon nitride film, a silicon oxynitride film, or a lamination film of those insulating film may also be used instead of the silicon oxide film.

Figure 1D:
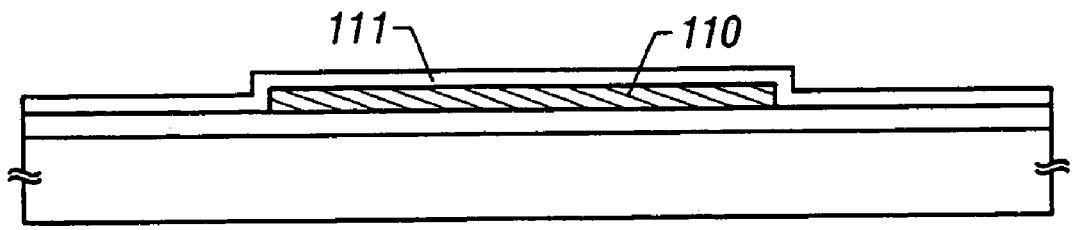

Next, a heat treatment (second heat treatment) in an atmosphere containing a halogen element is carried out. A primary object of this heat treatment is to remove the metal element (especially nickel) in the active layer 110 by using the gettering effect of the metal element by the halogen element (FIG. 1D).

It is important to carry out the heat treatment for this gettering at a temperature over 700° C. to obtain the gettering effect. If the temperature is lower than this temperature, there is a fear that a sufficient gettering effect can not be obtained since the gate insulating film 111 becomes a blocking layer.

Thus, the heat treatment is carried out at a temperature over 700° C., preferably 800 to 1000° C. (typically 950° C.), for 0.1 to 6 hours, typically 0.5 to 1 hour.

In this embodiment, the heat treatment at 950° C. for 30 minutes is carried out in an atmosphere containing hydrogen chloride (HCl) of 0.5 to 10 vol. % with respect to an oxygen ($O_2$) atmosphere. If the concentration of HCl is more than the above concentration, roughness comparable with the film thickness is formed on the film surface of the crystalline silicon film, so that it is not preferable.

In this embodiment, although HCl gas is exemplified as a compound containing the halogen element, other gas of one kind of or plural kinds of halogen containing compounds selected from the group consisting of HF, $NF_3$, HBr, $Cl_2$, $ClF_3$, $BCl_3$, $F_2$, and $Br_2$ may be used. In general, hydroxide or organic material (carbohydrate) of halogen may be used.

It is conceivable that in this step, nickel segregated in the crystal grain boundaries of the needle-shaped or column-shaped crystals is subjected to gettering by the operation of the halogen element (here, chlorine) so that nickel is converted into volatile nickel chloride and is separated into the air to be removed.

The nickel concentration in the active layer 110 which has not been subjected to the gettering treatment, is about $1 \times 10^{18}$ atoms/$cm^3$ at the maximum, and at least $5 \times 10^{17}$ atoms/$cm^3$ according to SIMS measurement. It is confirmed according to the SIMS analysis that the nickel concentration in the active layer 110 is decreased by the gettering treatment of this embodiment to $1 \times 10^{18}$ atoms/$cm^3$ or less, further decreased to $5 \times 10^{17}$ atoms/$cm^3$ or less.

Although the lower limit of detection of the SIMS is about $1 \times 10^{16}$ atoms/$cm^3$, according to characteristics of the TFT of this embodiment described later, it is conceivable that the nickel concentration is lower than spin density ($1 \times 10^{15}$ to $1 \times 10^{16}$ $cm^{-3}$) of the active layer 110, and is decreased to about $1 \times 10^{14}$ atoms/$cm^3$.

That is, by the gettering treatment, the concentration of nickel in the active layer 110 is decreased to $1 \times 10^{18}$ atoms/$cm^3$ or less, typically to a level not to influence the device characteristics (preferably less than spin density in the active layer), that is, $1 \times 10^{14}$ to $5 \times 10^{17}$ atoms/$cm^3$.

According to the finding of the present inventors, it is conceivable that the nickel used for promoting crystallization tends to be mainly segregated in the crystal grain boundaries of the needle-shaped or column-shaped crystals, and is substantially hardly contained in the inside of the needle-shaped or column-shaped crystals.

However, according to the present SIMS analysis, since both information of the inside of the crystals and the crystal grain boundaries are detected, the nickel concentration in the present specification strictly means an average concentration of nickel contained in the inside of crystals and the crystal grain boundaries.

In the case where the gettering step is carried out, the halogen element used for the gettering treatment remains in the crystalline silicon film at a concentration of $1 \times 10^{15}$ to $1 \times 10^{20}$ atoms/$cm^3$. At that time, the halogen element tends to be distributed between the crystalline silicon film and thermal oxidation film at a high concentration.

It is conceivable that nickel was pushed toward the crystal grain boundaries of the needle-shaped or column-shaped crystals at the crystallization and was segregated, so that nickel existed as nickel silicide. At the gettering, nickel is converted into nickel chloride and is separated, so that dangling bonds of silicon obtained by cutting of bonds with nickel, increase in the crystal grain boundaries.

However, it is conceivable that since the above steps are carried out in an oxidative atmosphere at a relatively high temperature, the formed dangling bonds are easily coupled with oxygen to form an oxide (silicon oxide represented by SiOx). That is, the present inventors consider that the crystalline silicon film becomes a crystalline structure body in which silicon oxide functions as crystal grain boundaries, by the above series of heating steps.

The remaining dangling bonds are terminated by hydrogen or the halogen element contained in the active layer 110 or are compensated by recombination of silicon atoms themselves. Further, the crystal defects such as dislocation or stacking fault are almost vanished by recombination or rearrangement of silicon atoms. Thus, it is conceivable that the crystallinity of the inside of the needle-shaped or column-shaped crystals is also remarkably improved.

Nickel in the active layer 110 is sufficiently removed by the heat treatment in the halogen atmosphere so that nickel does not damage the device characteristics, and the crystallinity of the needle-shaped or column-shaped crystals constituting the active layer 110 is remarkably improved. Thus, the active layer is constituted by the crystalline structure body including regions which can be considered to be substantially single crystal for carriers.

By the above heat treatment, thermal oxidation reaction proceeds at the interface between the active layer 110 and the gate insulating film 111, so that a silicon film of about 100 Å is oxidized and a thermal oxidation film of about 200 Å is formed. That is, the total film thickness of the gate insulating film 111 is 500 Å which is the sum of the thickness of the film formed by the CVD method and the thickness of the film formed by the thermal oxidation.

Further, after the above heat treatment in the halogen atmosphere is carried out, a heat treatment in a nitrogen atmosphere at 950° C. for about one hour is carried out, so that the film quality of the gate insulating film 111 is improved and an extremely superior interface between the semiconductor and insulating film is realized.

The active layer 110 is formed by a dry etching method, and there is a fear that plasma damages remaining in edges of the active layer at the formation of the active layer cause a leak current of a TFT. In the case of this embodiment, since the edges of the active layer are thermally oxidized, the heat treatment also serves to remove the plasma damages.

After the formation of the gate insulating film (thermal oxidation film) 111 is ended in this way, an aluminum film (not shown) with a thickness of 2500 Å for constituting a gate electrode is formed by a sputtering method. The aluminum film is made to contain scandium of 0.2 wt % to prevent hillocks or whiskers.

Although a material containing mainly aluminum is used as a material for forming the gate electrode (including gate wiring), other material such as tungsten, tantalum, or molybdenum may be used. A crystalline silicon film made conductive may be used as the gate electrode.

Figure 2A:
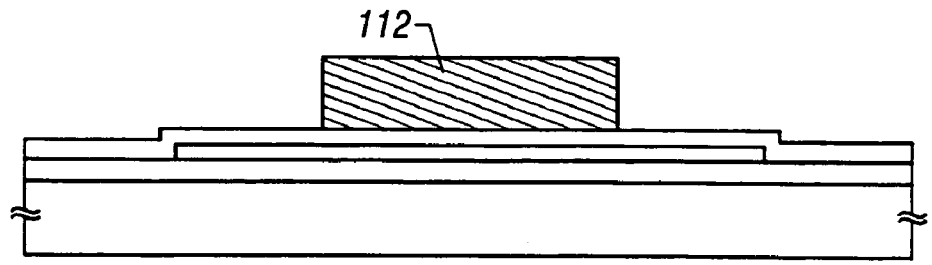
FIGS. 2A to 2D are views showing manufacturing steps of the semiconductor device.

Next, as shown in FIG. 2A, the aluminum film is patterned so that island pattern 112 of the aluminum film as an original form of the gate electrode is formed. A resist mask (not shown) used at this time is made to remain as it is (FIG. 2A).

Then, anodic oxidation using the pattern 112 of the aluminum film as an anode is carried out. This technique uses a well known anodic oxidation technique (for example, see Japanese Patent Unexamined Publication No. Hei. 7-135318). First, a porous anodic oxidation film 113 is formed at the side surface of the pattern 112 by this anodic oxidation step. In this embodiment, the film thickness of the anodic oxidation film 113 is made 0.7 µm.

Figure 2B:
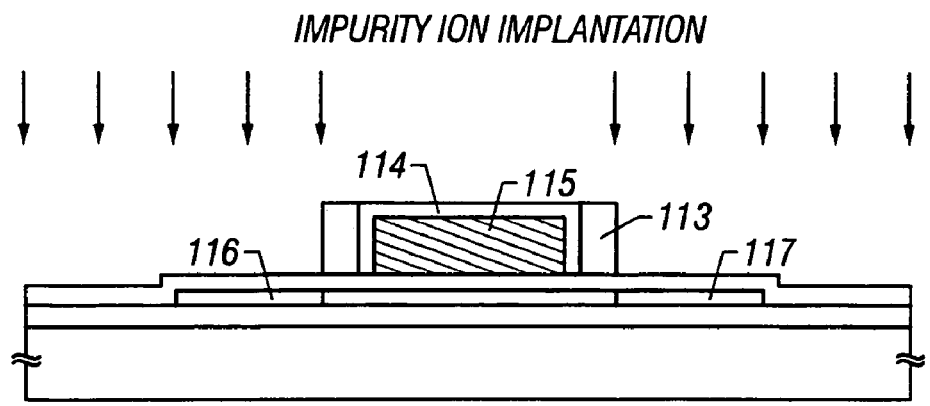

After the porous anodic oxidation film 113 as shown in FIG. 2B is formed, the not-shown resist mask is removed. Then, anodic oxidation is again carried out to form a dense anodic oxidation film 114. The film thickness of the dense anodic oxidized film 114 is made 900 Å.

A gate electrode 115 becomes definite through the above steps. The dense anodic oxidation film 114 serves to protect the surface of the gate electrode 115 in the subsequent step and to suppress the occurrence of hillocks or whiskers.

Next, after the dense anodic oxidation film 114 is formed, impurity ions for forming source/drain regions are implanted in this state. If an N-channel type TFT is to be manufactured, P (phosphorus) ions may be implanted, and if a P-channel type TFT is to be manufactured, B (boron) ions may be implanted.

In this step, a source region 116 and a drain region 117 to which impurities of high concentration are added are formed.

Figure 2C:
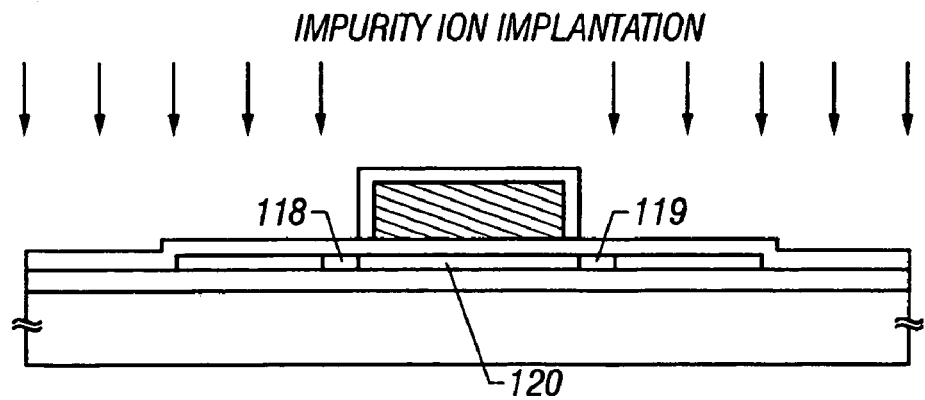

Next, after the porous anodic oxidation film 113 is selectively removed by using a mixed acid of acetic acid, phosphoric acid, and nitric acid, P ions are again implanted. This ion implantation is carried out at a dose lower than that at the formation of the source/drain regions (FIG. 2C).

Then, low concentration impurity regions 118 and 119 having an impurity concentration lower than the source region 116 and the drain region 117 are formed. A region 120 immediately below the gate electrode 115 becomes a channel formation region in self alignment.

The low concentration impurity region 119 disposed between the channel formation region 120 and the drain region 117 is called especially an LDD (lightly doped drain region) which has an effect to relieve a high electric field formed between the channel formation region 120 and the drain region 117

The channel formation region 120 (strictly the inside of the needle-shaped or column-shaped crystal) is constituted by an intrinsic or substantially intrinsic region. The intrinsic or substantially intrinsic region means that an activation energy is about ½ (Fermi level positions at the center of a forbidden band) and the impurity concentration is lower than the spin density, or is an undoped region in which impurities such as P or B are not intentionally added.

Further, after the above step of impurity ion implantation, annealing to the region subjected to the ion implantation is carried out by irradiation of laser light, infrared light or ultraviolet light. By this treatment, activation of added ions and recovery of damages of the active layer received at the ion implantation are carried out.

It is effective to carry out a hydrogenating treatment within a temperature range of 300 to 350° C. for 0.5 to 1 hour. In this step, dangling bonds generated by hydrogen separation from the active layer are again terminated by hydrogen. When this step is carried out, hydrogen of a concentration of $1\times10^{21}$ atoms/cm³ or less, preferably $1\times10^{15}$ to $1\times10^{21}$ atoms/cm³ is added.

After the state as shown in FIG. 2C is obtained in this way, an interlayer insulating film 121 is next formed. The interlayer insulating film 121 is constituted by a silicon oxide film, a silicon nitride film, a silicon oxynitride film, an organic resin film, or a lamination film of those films (FIG. 2D)

If polyimide of the organic resin film is used, since the relative dielectric constant is small, parasitic capacitance between upper and lower wirings can be decreased. Further, since the polyimide film can be formed by a spin coating method, the film thickness can be easily made thick so that the throughput can be improved.

Next, contact holes are formed in the interlayer insulating film 121, and a source electrode 122 and a drain electrode 123 are formed. Further, a heat treatment in a hydrogen atmosphere at 350° C. is carried out so that the entire of a device is hydrogenated and the TFT shown in FIG. 2D is completed.

Figure 2D:
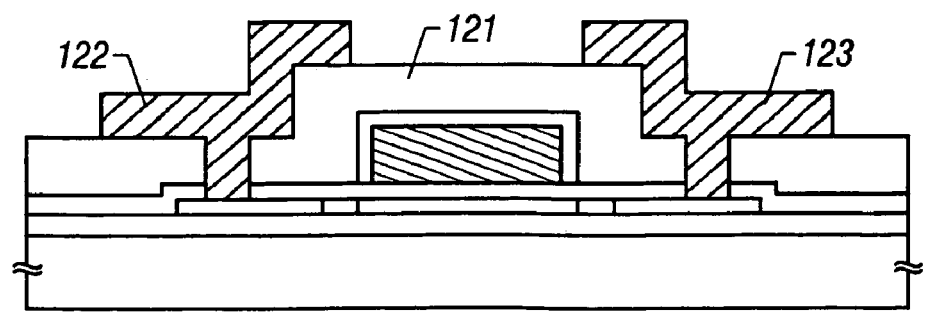

Although the TFT as shown in FIG. 2D has the simplest structure for explanation, it is easy to make a desired TFT structure by adding some change and/or addition to the manufacturing steps of this embodiment.

Here, the reason why the arrangement of the active layer 110 is important at the formation thereof, will be described with reference to FIG. 3.

When this embodiment is practiced, the needle-shaped or column-shaped crystals grow substantially parallel with each other, so that this embodiment has a feature that the crystal grain boundaries are aligned in one direction. Further, if the metal element for promoting crystallization is selectively added, it is possible to freely control the direction in which the needle-shaped or column-shaped crystals grow. This has a very important meaning.

Figure 3:
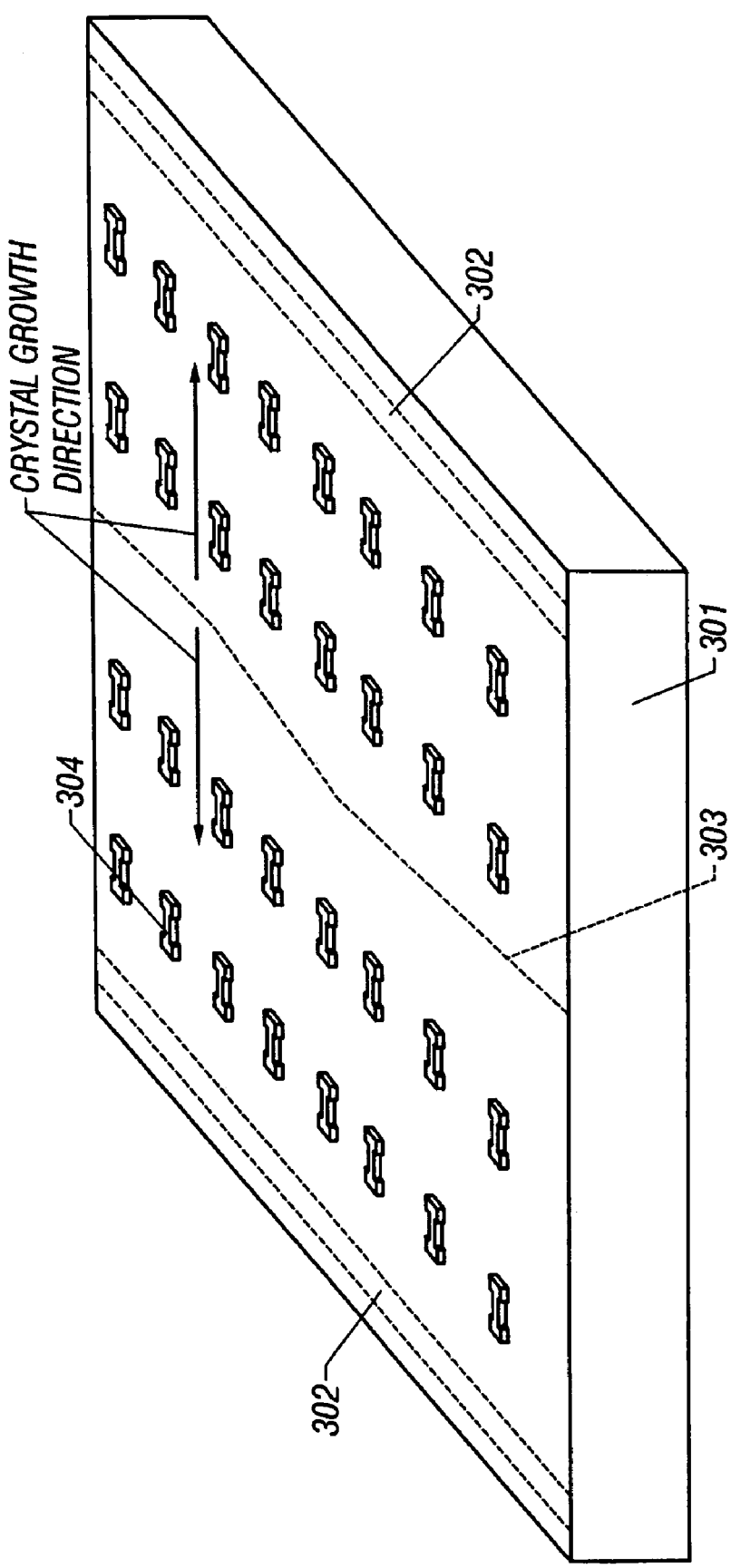
FIG. 3 is a view showing a structure of arrangement of an active layer.

Here an example in which an active layer is formed on a substrate having an insulating surface will be shown in FIG. 3. FIG. 3 shows active layers disposed in a matrix form on a substrate 301 when an active matrix type liquid crystal display device is manufactured.

Regions indicated by dotted lines 302 are places where regions for selectively introducing nickel existed. Reference numeral 303 denotes a place where macroscopic grain boundaries formed by collision of lateral growth regions existed. Since these regions can not be confirmed after formation of the active layer, these are indicated by the dotted lines.

In the case where crystallization is carried out by the means shown in this embodiment, the needle-shaped or column-shaped crystals grow in the direction (direction indicated by arrows in the drawing) substantially vertical to the nickel added region 302.

Accordingly, if the island regions 304 are arranged as shown in FIG. 3, it is possible to align the channel direction and the crystal grain boundaries of the needle-shaped or column-shaped crystals so that they substantially coincide with each other. Further, if the nickel added region 302 is designed so that it extends from end to end of the substrate 301, it is possible to realize the above structure on the entire of the substrate.

When such a structure is provided, the channel direction and the needle-shaped or column-shaped crystals coincide with each other. That is, this means that when the crystals function as active layers of TFTs, energy barriers for blocking the movement of carriers in the channel formation regions are extremely small, so that further improvement of operation speed can be expected.

In other words, the above statement means that it is possible to control the directionality of the needle-shaped or column-shaped crystals so that it has a specific angle with respect to the channel direction. FIG. 3 shows the case where the specific angle is 0°.

That is, from the viewpoint different from FIG. 3, it is also possible to consider the case where the active layer 304 is rotated by 90°. In this case, although the mobility of carriers is lowered, it is possible to expect low off-state current characteristics and high withstand voltage characteristics.

Figure 4A:
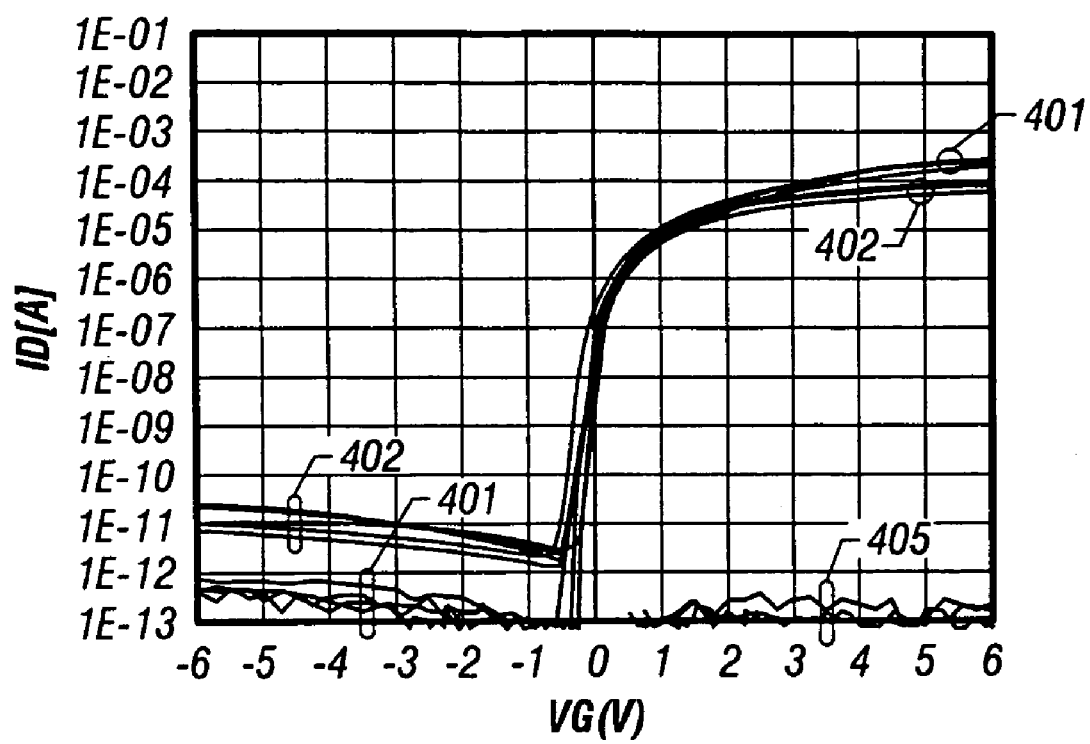
FIGS. 4A and 4B are views showing characteristics of a semiconductor device.
Figure 4B:
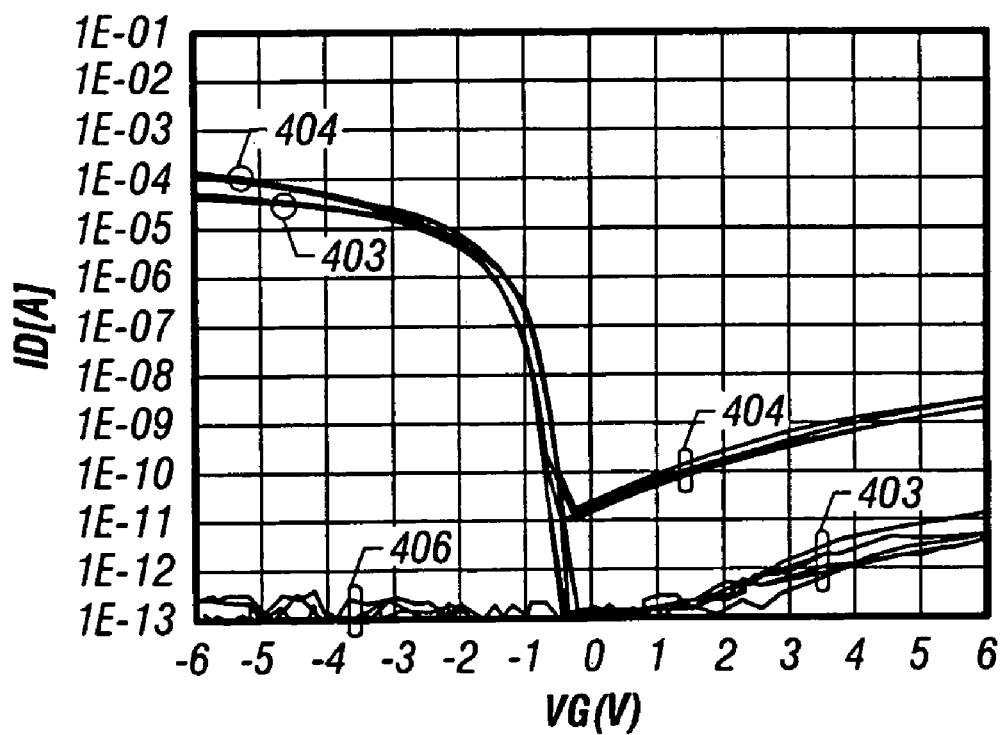

FIG. 4 shows electric characteristics of a semiconductor device shown in FIG. 2D and manufactured by the present inventors in accordance with this embodiment. FIG. 4A shows electric characteristics (Id-Vg characteristics) of an N-channel type TFT, and FIG. 4B shows electric characteristics of a P-channel type TFT. In the graphs showing Id-Vg characteristics, measuring results of five points are put together to be shown.

VG at the axis of abscissas indicates values of gate voltage, and ID at the axis of ordinates indicates values of current flowing between the source and drain. Id-Vg characteristics (Id-Vg curved line) designated by 401 and 403 indicate characteristics when drain voltage VD=1V. Id-Vg characteristics designated by 402 and 404 indicate the characteristics when drain voltage VD=5V. Reference numeral 405 and 406 denotes leak currents when voltage VD=1V.

Since almost all values of drain current (Ioff) in the off-state region (not more than −1V in FIG. 4A, not less than −1V in FIG. 4B) and leak current (IG) in the on-state and off-state regions are not larger than $1\times10^{-13}$A (lower limit of measurement), they are mixed up with noise.

Tables 1 and 2 show typical characteristic parameters of the TFT according to the present invention, which are obtained from the electric characteristics shown in FIGS. 4A and 4B. Table 1 shows the result of electric characteristics (measurement of arbitrary twenty points) of an N-channel type TFT, and Table 2 shows the result of electric characteristics (measurement of arbitrary twenty point) of a P-channel type TFT.

TABLE 1

MEASUREMENT RESULT OF N-CHANNEL TYPE TFT (Single Gate)

| Measurement Point | IonO1 [µA] (VD = 1 V) (VG = 5 V) | IonO2 [µA] (VD = 5 V) (VG = 5 V) | IoffO1 [pA] (VD = 1 V) (VG = −6 V) | IoffO2 [pA] (VD = 5 V) (VG = −1 V) | Ion/Ioff1 | Ion/Ioff2 | Vth [V] (VD = 5 V) | S-value [mV/dec] (VD = 1 V) | µFE[cm2/Vs] (VD = 1 V) (VG = 5 V) | µFE[cm2/Vs] (VD = 1 V) (max) | IG on (pA) (VD = 1 V) (VG = 5 V) | IG off (pA) (VD = 1 V) (VG = −6 V) |
|---|---|---|---|---|---|---|---|---|---|---|---|---|
| Point 1 | 68.51 | 205.3 | 1 | 3.3 | 7.84 | 7.79 | 0.08 | 82.66 | 160.91 | 226.64 | 0.2 | −0.4 |
| Point 2 | 72.8 | 219.05 | 0.75 | 3.85 | 7.99 | 7.76 | 0.12 | 71.1 | 171.21 | 245 | 0.1 | −0.05 |
| Point 3 | 74.35 | 221.85 | 0.45 | 2.65 | 8.22 | 7.92 | 0.05 | 86.92 | 170.6 | 246.84 | 0.15 | −0.15 |
| Point 4 | 62.61 | 201.7 | 0.4 | 2.15 | 8.19 | 7.97 | −0.13 | 79.6 | 141.63 | 197.88 | −0.05 | −0.25 |
| Point 5 | 48.07 | 151.25 | 0.4 | 1.6 | 8.08 | 7.98 | 0 | 95.12 | 113.99 | 153.26 | 0.1 | −0.1 |
| Point 6 | 74 | 221.7 | 0.3 | 2.45 | 8.39 | 7.96 | 0.01 | 84.31 | 165.85 | 245.36 | −0.1 | −0.3 |
| Point 7 | 55.3 | 176.6 | 0.95 | 2.85 | 7.77 | 7.79 | 0.05 | 82.1 | 137.19 | 175.19 | 0.1 | −0.15 |
| Point 8 | 69.9 | 208.05 | 0.75 | 4.35 | 7.97 | 7.68 | 0.11 | 75.08 | 165.49 | 232.56 | 0.25 | 0 |
| Point 9 | 60.91 | 184.95 | 0.25 | 1.95 | 8.39 | 7.98 | 0.02 | 93.08 | 136.58 | 202.16 | 0.05 | −0.1 |
| Point 10 | 60.2 | 189.65 | 0.5 | 2.15 | 8.08 | 7.95 | 0.01 | 76.93 | 137.96 | 199.16 | 0.3 | 0 |
| Point 11 | 63.43 | 195.45 | 0.4 | 2.4 | 8.2 | 7.91 | −0.06 | 78.77 | 136.48 | 210.12 | 0 | −0.25 |
| Point 12 | 63.57 | 193.45 | 0.45 | 2.4 | 8.15 | 7.91 | −0.05 | 75.78 | 140.5 | 207.06 | 0.1 | −0.6 |
| Point 13 | 68.51 | 211.45 | 0.4 | 2.85 | 8.23 | 7.87 | 0.01 | 78.62 | 160.14 | 222.12 | 0.4 | −0.55 |
| Point 14 | 66.78 | 204.05 | 0.4 | 2.1 | 8.22 | 7.99 | −0.02 | 74.36 | 148.21 | 220.63 | 0.3 | −0.5 |
| Point 15 | 61.3 | 185.95 | 0.45 | 2.35 | 8.13 | 7.9 | 0.05 | 81.25 | 137.9 | 205.02 | 0 | −0.45 |
| Point 16 | 68.7 | 208.75 | 0.35 | 1.9 | 8.29 | 8.04 | −0.01 | 71.23 | 151.01 | 227.97 | 0.15 | −0.3 |
| Point 17 | 68.18 | 211.5 | 0.4 | 1.8 | 8.23 | 8.07 | −0.08 | 71.1 | 148.36 | 223.84 | 0.3 | −0.6 |
| Point 18 | 63.92 | 197.5 | 0.4 | 1.65 | 8.2 | 8.08 | −0.1 | 75.64 | 142.34 | 205.02 | 0.2 | −0.35 |
| Point 19 | 66.07 | 201.25 | 0.6 | 2.7 | 0.04 | 7.87 | 0.17 | 87.23 | 167.03 | 216.19 | 0.25 | −0.4 |
| Point 20 | 70.37 | 210.8 | 0.6 | 2.05 | 8.07 | 8.01 | 0.02 | 79.04 | 162.28 | 229.81 | 0.2 | −0.3 |
| Average value | 65.37 | 200.01 | 0.51 | 2.47 | 8.13 | 7.92 | 0.01 | 80 | 149.79 | 214.59 | 0.15 | −0.29 |
| Standard deviation σ | 6.40 | 16.87 | 0.2 | 0.71 | 0.16 | 0.1 | 0.08 | 6.78 | 15.16 | 23.19 | 0.13 | 0.19 |

TABLE 2

MEASUREMENT RESULT OF P-CHANNEL TYPE TFT (Single Gate)

| Measurement Point | IonO1 [µA] (VD = 1 V) (VG = 5 V) | IonO2 [µA] (VD = 5 V) (VG = 5 V) | IoffO1 [pA] (VD = 1 V) (VG = −6 V) | IoffO2 [pA] (VD = 5 V) (VG = −1 V) | Ion/Ioff1 | Ion/Ioff2 | Vth [V] (VD = 5 V) | S-value [mV/dec] (VD = 1 V) | µFE[cm2/Vs] (VD = 1 V) (VG = 5 V) | µFE[cm2/Vs] (VD = 1 V) (max) | IG on (pA) (VD = 1 V) (VG = 5 V) | IG off (pA) (VD = 1 V) (VG = −6 V) |
|---|---|---|---|---|---|---|---|---|---|---|---|---|
| Point 1 | 30.07 | 68.22 | 9.25 | 59.25 | 6.51 | 6.06 | −1.11 | 86.55 | 118.32 | 119.6 | 0.1 | 0.00 |
| Point 2 | 36.67 | 86.63 | 2.6 | 46.7 | 7.15 | 6.27 | −0.93 | 89.24 | 131.38 | 137.9 | 0.05 | −0.2 |
| Point 3 | 36.6 | 85.97 | 2.9 | 73.25 | 7.1 | 6.07 | −0.95 | 98.47 | 133.57 | 138.47 | 0.15 | −0.1 |
| Point 4 | 36.63 | 85.27 | 3.35 | 53.6 | 7.04 | 6.2 | −0.98 | 87.55 | 137.19 | 140 | 0.05 | −0.2 |
| Point 5 | 35.3 | 79.59 | 3.25 | 39.4 | 7.04 | 6.31 | −1.14 | 77.67 | 140.71 | 142.24 | 0.1 | −0.2 |
| Point 6 | 35.72 | 81.38 | 2.55 | 30.45 | 7.15 | 6.43 | −1.08 | 73.81 | 141.07 | 141.78 | 0.1 | −0.05 |
| Point 7 | 34.37 | 77.74 | 5.5 | 73.6 | 6.8 | 6.02 | −1.1 | 82.63 | 135.15 | 136.94 | −0.05 | −0.2 |

TABLE 2-continued

MEASUREMENT RESULT OF P-CHANNEL TYPE TFT (Single Gate)

| Measurement Point | IonO1 [µA] (VD = 1 V) (VG = 5 V) | IonO2 [µA] (VD = 5 V) (VG = 5 V) | IoffO1 [pA] (VD = 1 V) (VG = −6 V) | IoffO2 [pA] (VD = 5 V) (VG = −1 V) | Ion/ Ioff1 | Ion/ Ioff2 | Vth [V] (VD = 5 V) | S-value [mV/dec] (VD = 1 V) | µFE[cm2/Vs] (VD = 1 V) (VG = 5 V) | (VD = 1 V) (max) | IG on (pA) (VD = 1 V) (VG = 5 V) | IG off (pA) (VD = 1 V) (VG = −6 V) |
|---|---|---|---|---|---|---|---|---|---|---|---|---|
| Point 8 | 40.7 | 100.42 | 10.2 | 107.25 | 6.6 | 5.97 | −0.77 | 73.28 | 131.58 | 147.9 | 0.1 | 0.05 |
| Point 9 | 40.7 | 100.61 | 4.9 | 45 | 6.92 | 6.35 | −0.76 | 75.5 | 131.83 | 147.14 | 0.15 | −0.25 |
| Point 10 | 32.89 | 74.66 | 5.75 | 132.05 | 6.76 | 5.75 | −1.1 | 84.48 | 127.76 | 129.8 | 0.15 | 0.05 |
| Point 11 | 37.07 | 88.45 | 4.3 | 67.45 | 6.94 | 6.12 | −0.87 | 76.54 | 130.05 | 137.45 | 0.4 | −0.35 |
| Point 12 | 30.52 | 68.83 | 1.65 | 37.55 | 7.27 | 6.26 | −1.15 | 90.61 | 120.82 | 122.15 | 0.5 | −0.3 |
| Point 13 | 35.17 | 78.92 | 1.35 | 55.5 | 7.42 | 6.15 | −1.15 | 85.88 | 143.51 | 143.82 | 0.4 | −0.4 |
| Point 14 | 32.07 | 72.71 | 1.8 | 36.4 | 7.25 | 6.3 | −1.1 | 86.48 | 124.39 | 126.74 | 0.4 | −0.45 |
| Point 15 | 33.36 | 75.57 | 6.6 | 120.4 | 6.7 | 5.8 | −1.1 | 84.3 | 131.58 | 132.65 | 0.4 | −0.35 |
| Point 16 | 32.29 | 75.1 | 3.5 | 47.9 | 6.96 | 6.2 | −1.01 | 84.93 | 122.35 | 124.64 | 0.25 | −0.35 |
| Point 17 | 34.26 | 76.83 | 4.4 | 64.35 | 6.89 | 6.08 | −1.14 | 83.28 | 141.58 | 141.58 | 0.65 | −0.25 |
| Point 18 | 31.01 | 69.91 | 5.4 | 253.39 | 6.76 | 5.44 | −1.18 | 97.07 | 123.17 | 125.46 | 0.25 | −0.5 |
| Point 19 | 36.26 | 86.8 | 5.8 | 52.2 | 6.8 | 6.22 | −0.89 | 79.86 | 126.53 | 134.64 | 0.4 | −0.25 |
| Point 20 | 37.6 | 93.11 | 2507.9 | 17345 | 4.18 | 3.73 | −0.8 | 89.54 | 125.46 | 136.94 | 0.15 | −0.3 |
| Average value | 34.96 | 81.34 | 129.65 | 937.03 | 6.81 | 5.99 | −1.02 | 84.38 | 130.9 | 135.39 | 0.23 | −0.23 |
| Standard deviation σ | 3 | 9.49 | 559.79 | 3862.36 | 0.66 | 0.58 | 0.14 | 6.94 | 7.38 | 8.24 | 0.18 | 0.16 |

Especially noticeable points in Tables 1 and 2 are that the subthreshold characteristics (S-value) are so small that they are within the range of 60 to 100 mV/dec, and the mobility (µFE) has such a very large value as 150 to 300 cm²/Vs. The mobility in the present specification means field effect mobility.

These measurement data can not be attained by a conventional TFT, and it verifies that the TFT of the present invention is a very high performance TFT comparable with a MOSFET fabricated on a single crystal.

At the same time, it is confirmed by an accelerated degradation test through repeated measurements that the TFT of the present invention has high resistance against degradation. Empirically, a TFT operating at high speed has a defect that it is apt to be deteriorated. However, it turns out that the TFT of the present invention does not deteriorate and has very high withstand voltage characteristics.

Tables 1 and 2 also show average values and standard deviations (σ values) for reference. The standard deviation is used as a scale indicating dispersion (variation) from an average value. Generally, assuming that measurement results (population) are in accordance with the normal distribution (Gaussian distribution), it is known that 68.3% of the entire is within the range of ±1σ with the center of the average value, 95.4% within the range of ±2σ, and 99.7% within the range of ±3σ.

The present inventors measured 540 pieces of TFT in order to more accurately estimate the dispersion of the TFT characteristics of this embodiment, and obtained the average value and standard deviation from the results. As a result, the average value of S-values was 80.5 mV/dec (n-ch) and 80.6 mV/dec (p-ch), and the standard deviation was 5.8 (n-ch) and 11.5 (p-ch). The average value of mobility (max) was 194.0 cm²/Vs (n-ch) and 131.8 cm²/Vs (p-ch), and the standard deviation was 38.5 (n-ch) and 10.2 (p-ch).

That is, in the N-channel type TFT using the present invention, the TFT characteristics as shown below can be obtained.

(1) σ-value of S-values is within 10 mV/dec, preferably 5 mV/dec.

(2) S-values are within 80±30 mV/dec, preferably 80±15 mV/dec.

(3) σ-value of µFE is within 40 cm²/Vs, preferably 35 cm²/Vs.

Also, in the P-channel type TFT using the present invention, the TFT characteristics as shown below can be obtained.

(1) σ-value of S-values is within 15 mV/dec, preferably 10 mV/dec.

(2) S-values are within 80±45 mV/dec, preferably 80±30 mV/dec.

(3) σ-value of µFE is within 15 cm²/Vs, preferably 10 cm²/Vs.

As described above, the TFT according to the present invention realizes extremely superior electric characteristics, and the TFT can constitute a logic circuit requiring high speed operation, such as a complicated SRAM circuit or a DRAM circuit in which only MOSFETs formed on a single crystal have been conventionally used.

Although manufacturing steps of a single gate structure are disclosed in this embodiment, the present invention can be applied to a TFT having a double gate structure or a multi gate structure including more gate electrodes.

The present invention can be realized by increasing the crystallinity of an active layer, and can be practiced irrespective of TFT structures as long as heat resistance allows.

[Knowledge as to Crystalline Structure Body Obtained by the Present Invention]

Figure 10:
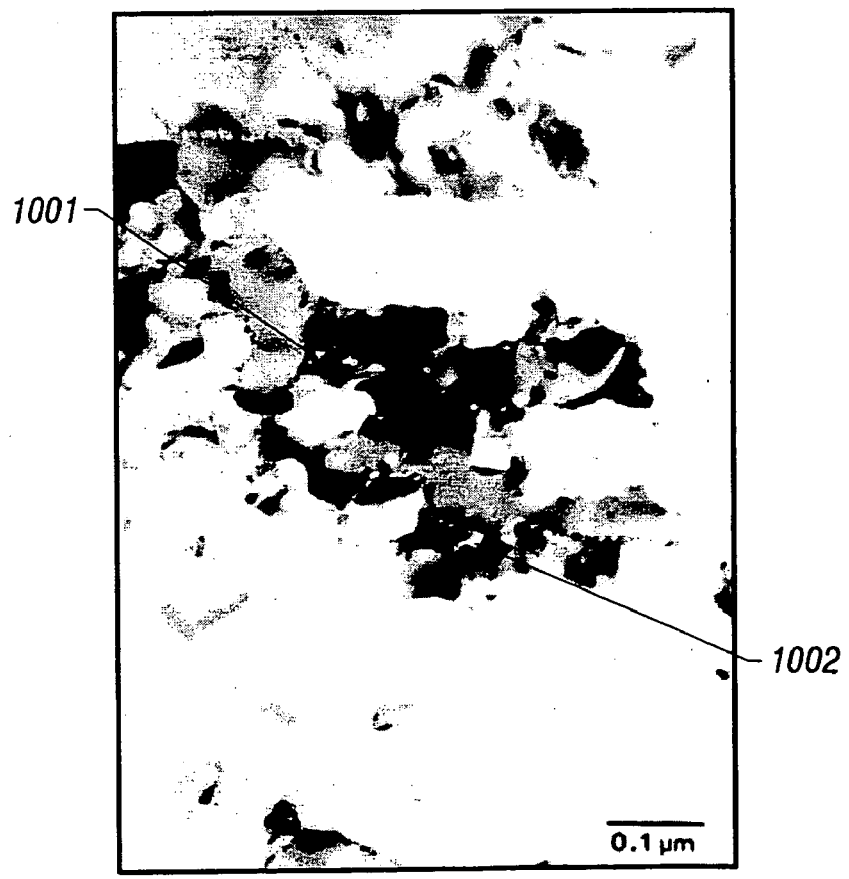
FIG. 10 is a photograph showing a crystal structure.

It has been already disclosed that the crystalline silicon film obtained by the present invention is a crystalline structure body made of aggregation of needle-shaped or column-shaped crystals as shown in FIG. 10. Here, comparison between the crystalline structure body of the present invention and a crystalline structure body obtained by other method will be carried out.

Figure 11:
FIG. 11 is a photograph showing a crystal structure.

A photograph shown in FIG. 11 is a TEM photograph of a sample in which crystallization of an amorphous silicon film is completed through the procedure of the first embodiment. That is, the drawing shows the crystal structure of a crystalline silicon film which is not subjected to the heat treatment including the halogen element.

As is confirmed in FIG. 11, there are many dislocation defects (in a circle designated by 1101) in the inside of the needle-shaped or column-shaped crystals immediately after crystallization. However, in the TEM photograph shown in FIG. 10, such dislocation defects can not be confirmed in the inside of the crystals, and it is understood that fine crystal structure is obtained.

This verifies that the heat treatment in the atmosphere containing the halogen element greatly contributes to improvement of crystallinity.

Figure 12:
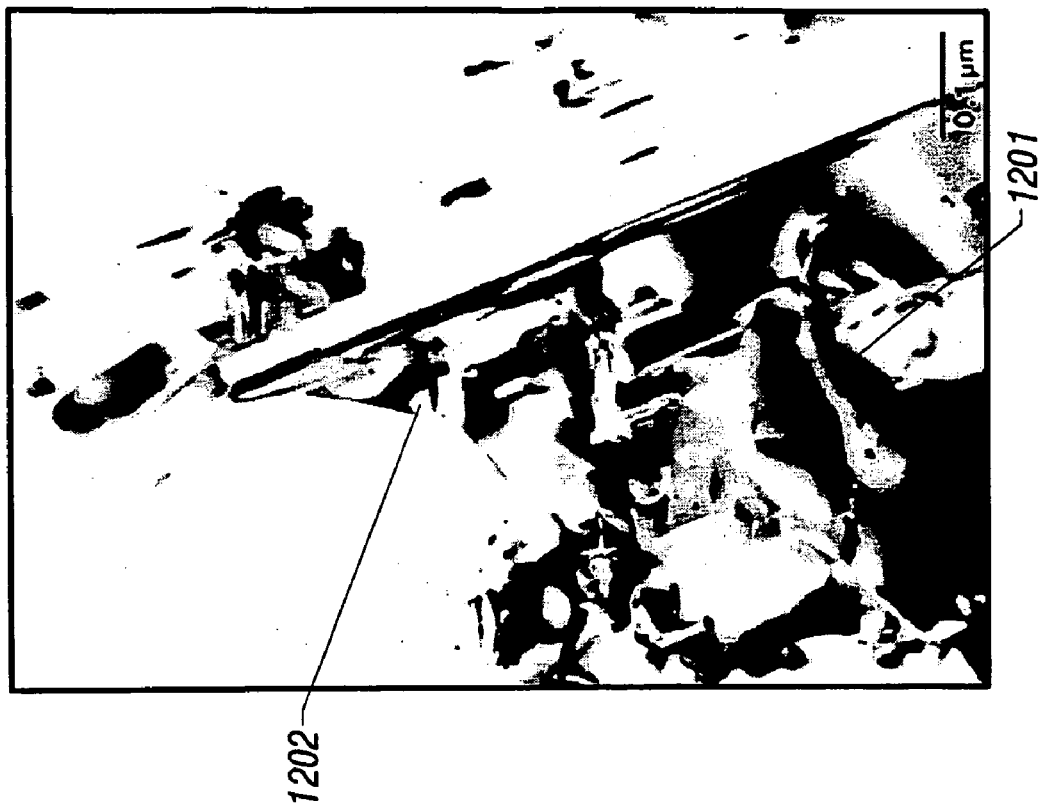
FIG. 12 is a photograph showing a crystal structure.

FIG. 12 shows a crystalline structure body in the case where conditions of crystallization of an amorphous silicon film are made different from the present invention. Specifically, a heat treatment in a nitrogen atmosphere at 600° C. for 48 hours is carried out to crystallize the amorphous silicon film, and a thermal oxidation treatment at about 900 to 1100° C. is carried out.

The crystalline silicon film formed in the manner described above has a state in which respective crystal grains are large and are divided by irregularly distributed grain boundaries.

In FIG. 12, crystal grains 1201 are surrounded by irregular grain boundaries 1202. Thus, if the crystalline structure body shown in FIG. 12 is actually used as an active layer of a TFT, energy barriers generated by the irregular grain boundaries 1202 block the movement of carriers.

On the other hand, the crystalline structure body shown in FIG. 10 has a state in which the crystal grain boundaries 1002 are arranged with certain degree of regularity. Thus, it is conceivable that there is no energy barrier to block the movement of carriers in the inside of the needle-shaped or column-shaped crystals.

As a result of observation of arranging state of the needle-shaped or column-shaped crystals by a wide field of about ten thousands to fifty thousands magnifications conducted by the present inventors, it is confirmed that there is a case where the needle-shaped or column-shaped crystals proceed zigzag. This is a phenomenon caused by the tendency that crystal growth proceeds toward a direction stable in view of energy. It is inferred that a kind of grain boundary is formed at the portion where the crystal direction is changed.

However, the present inventors infer that the grain boundaries generated in the inside of the needle-shaped or column-shaped crystal are those like twin grain boundaries inactive in energy. That is, the inventors infer that they are grain boundaries continuously coupled in good alignment though the crystal directions are different from each other, and they are such grain boundaries (substantially not considered to be grain boundaries) that they do not become energy barriers to block the movement of carries.

As described above, the crystalline silicon film crystallized by a general process has the crystalline structure as shown in FIG. 12, and since the irregular grain boundaries are distributed to block the movement of carriers, it is difficult to attain a high mobility.

However, the crystalline silicon film of the present invention has the crystalline structure as shown in FIG. 10, and the crystal grain boundaries are aligned substantially in one direction, and it is conceivable that there are no grain boundaries substantially as energy barriers in the inside of the needle-shaped or column-shaped crystals. That is, carriers can move in the inside of the crystals without being blocked so that an extremely high mobility can be attained.

Especially, the noticeable point of the needle-shaped or column-shaped crystals obtained by the present invention is that it is conceivable that the crystals grow continuously over a distance of several tens to several hundred μm while avoiding distortion due to roughness, stress or the like (changing the crystal direction).

If the inference of the present inventors is correct, the crystalline silicon film of the present invention is a quite new crystalline structure body constituted by aggregation of specific crystals in which crystals grow without forming grain boundaries which can be carrier traps.

[Second Embodiment]

In this embodiment, a CMOS circuit is formed by a TFT shown in the first embodiment. The CMOS circuit is constituted by complementarily combining an N-channel type TFT and a P-channel type TFT having the structure as shown in the first embodiment.

Manufacturing steps of the CMOS circuit of this embodiment will be described with reference to FIGS. 5 and 6. The range of application of the crystalline silicon film formed by the present invention is wide, and the method of forming the CMOS circuit is not limited to this embodiment.

First, in accordance with the manufacturing procedure shown in the first embodiment, a silicon oxide film 502 is formed on a quartz substrate 501, and a crystalline silicon film (not shown) is formed thereon. By patterning the crystalline silicon film, an active layer 503 for an N-channel type TFT and an active layer 504 of a P-channel type TFT are formed.

After the active layers 503 and 504 are formed, a gate insulating film 505 is formed, and further a heat treatment in an atmosphere containing a halogen element is carried out. In this embodiment, the processing conditions are made the same as the first embodiment. In this way, the active layers 503 and 504 become the crystalline structure body of the present invention, and a gate insulating film 505 having superior film quality and an interface is formed.

Next, an aluminum film (not shown) subsequently constituting an original form of a gate electrode is formed, and is patterned so that patterns 506 and 507 of the aluminum film are formed (resist mask used for patterning is made to remain even after the formation of the patterns).

Figure 5A:
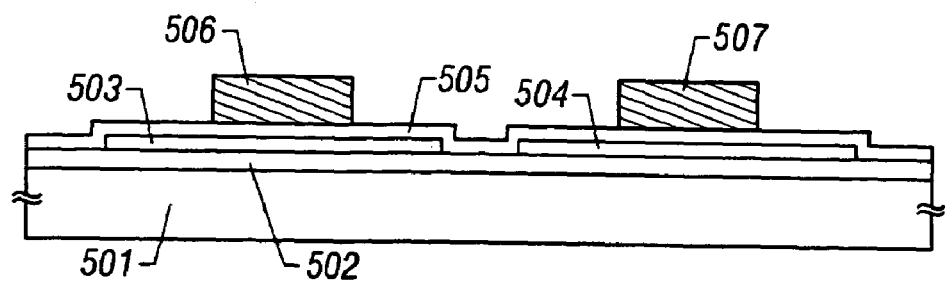
FIGS. 5A to 5D are views showing manufacturing steps of a semiconductor device.

In this way, the state shown in FIG. 5A is obtained. After formation of the patterns 506 and 507 of the aluminum film, porous anodic oxidation films 508 and 509 are formed at the sides of the patterns 506 and 507 of the aluminum film under the same conditions as the first embodiment. In this embodiment, the film thickness of the porous anodic oxidation films 508 and 509 are made 0.5 μm.

Figure 5B:
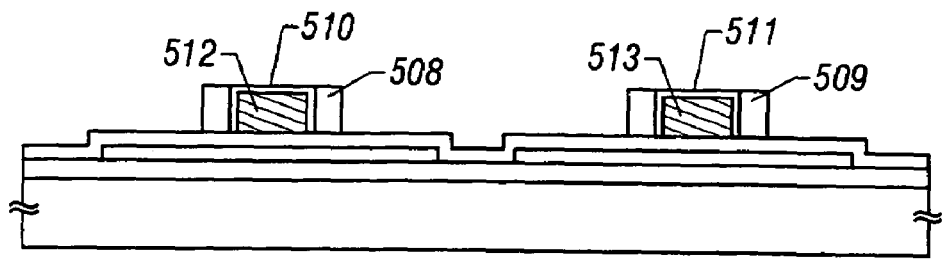

Further, under the same condition as the first embodiment, dense and firm anodic oxidation films 510 and 511 are formed. However, in this embodiment, the final voltage is adjusted so that the film thickness is made 700 Å. In this step, the gate electrodes 512 and 513 become definite. In this way, the state shown in FIG. 5B is obtained.

Figure 5C:
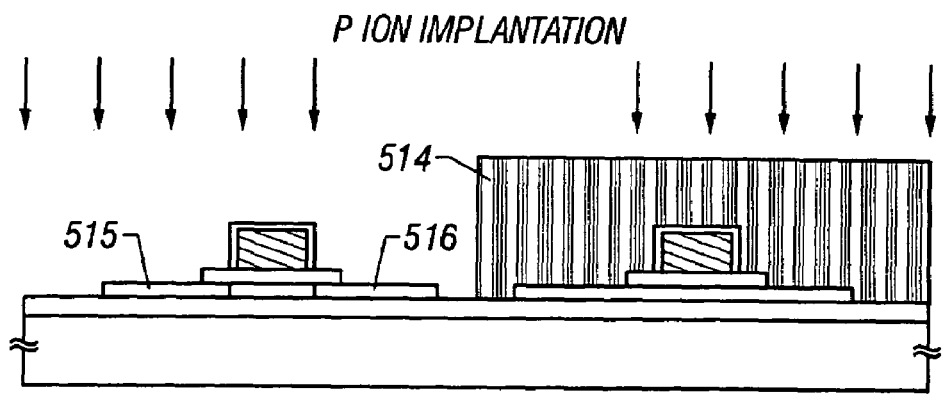

After the state shown in FIG. 53 is obtained, the gate insulating film 505 is etched by a dry etching method. In this etching step, the gate electrodes 512 and 513 and the porous anodic oxidation films 508 and 509 serve as a mask so that only the gate insulating films immediately below them remain. When the porous anodic oxidation films 508 and 509 are removed after etching, the state shown in FIG. 5C is obtained.

Next, a resist mask 514 is formed so as to cover the P-channel type TFT, and doping of P (phosphorus) ions as impurities to give N-type conductivity are carried out. This doping is carried out at an acceleration voltage of 50 KeV, a dose of 0.1 to $5 \times 10^{13}$ atoms/cm², preferably 0.5 to $2 \times 10^{13}$ atoms/cm².

Since an acceleration voltage in this doping step is relatively high, P ions pass through the exposed gate insulating film and are implanted into the active layer 503. As a result, P ions are added into regions 515 and 516 (FIG. 5C).

Next, as shown in FIG. 5D, P ions are again implanted. This implantation of P ions is carried out at such a low acceleration voltage as 5 Kev, and at a dose of 0.1 to $1 \times 10^{15}$ atoms/cm², preferably 2 to $5 \times 10^{14}$ atoms/cm². As a result of this step, regions 517 and 518 where P ions of high concentration are added, are formed.

Figure 5D:
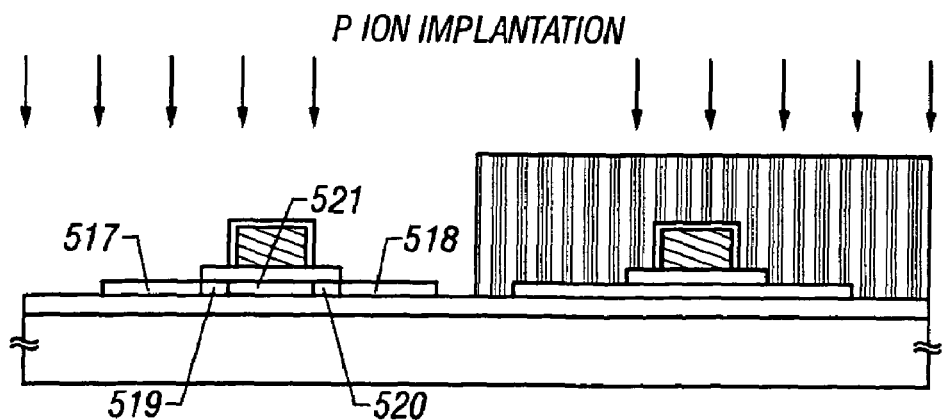

At the time when the step shown in FIG. 5D is completed, an active layer of the N-channel type TFT is completed. That is, a source region 517, a drain region 518, low concentration impurity regions (or LDD regions) 519 and 520, and a channel formation region 521 of the N-channel type TFT become definite.

Figure 6A:
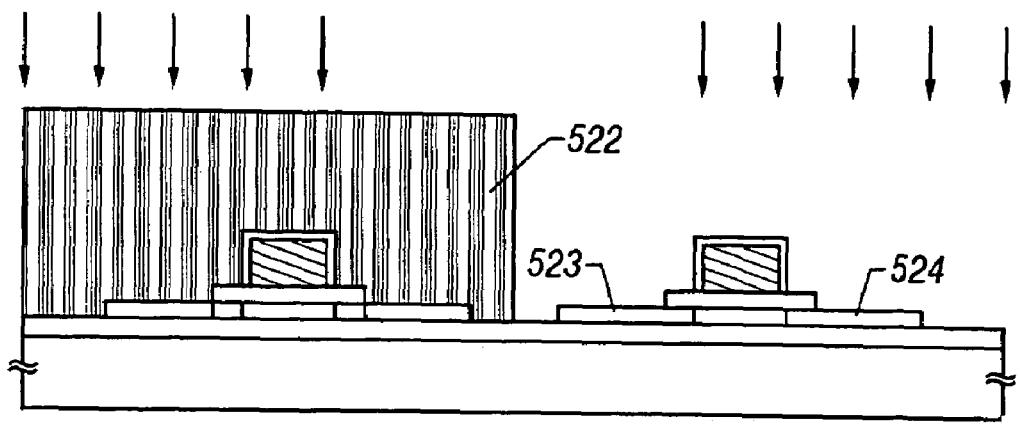
FIGS. 6A to 6C are views showing manufacturing steps of the semiconductor device.

Next, as shown in FIG. 6A, a resist mask 522 covering the left side N-channel type TFT is formed. In the state shown in FIG. 6A, implantation of B (boron) ions as impurities to give P-type conductivity is carried out. Doping of B ions is carried out in two steps as in the case of P ions.

The first B ion doping is carried out at an acceleration voltage of 30 Kev and at a dose of 0.1 to $5 \times 10^{14}$ atoms/cm², preferably about 0.5 to $2 \times 10^{14}$ atoms/cm². According to this step, B ions are added into the regions 523 and 524 (FIG. 6A).

The second B ion doping is carried out at an acceleration voltage of 5 Kev and at a dose of 0.1 to $1 \times 10^{15}$ atoms/cm², preferably 2 to $5 \times 10^{14}$ atoms/cm². By this step, regions 525 and 526 where B ions of high concentration are added, are formed (FIG. 6B).

By the above steps, a source region 525, a drain region 526, low concentration impurity regions (or LDD regions) 527 and 528, and a channel formation region 529 of the P-channel type TFT become definite.

Figure 6B:
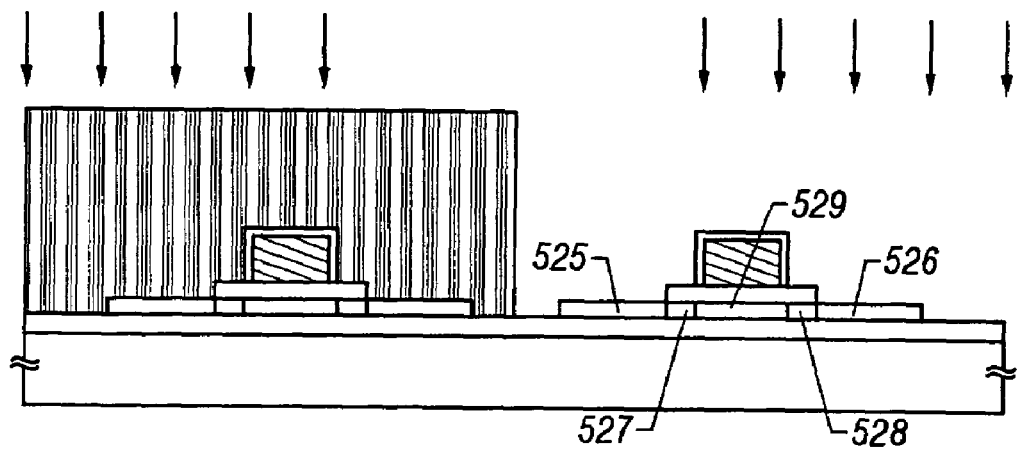

Next, after the completion of the step shown in FIG. 6B, the resist mask 522 is removed, and intense light such as laser light, infrared light, or ultraviolet light is irradiated to the entire surface of the substrate. By this step, the added impurity ions are activated and damages of regions where impurity ions are implanted are recovered.

Next, an interlayer insulating film 530 with a thickness of 4000 Å is formed. The interlayer insulating film 530 may be formed of any of a silicon oxide film, a silicon oxynitride film, a silicon nitride film, and an organic resin film, or may be formed of a multilayer structure. These insulating films is formed by a plasma CVD method, a thermal CVD method, or a spin coating method.

Next, contact holes are formed, and a source electrode 531 of the N-channel type TFT and a source electrode 532 of the P-channel type TFT are formed. A drain electrode 533 is commonly possessed by the N-channel type TFT and the P-channel type TFT so that the CMOS circuit is realized (FIG. 6C).

Figure 6C:
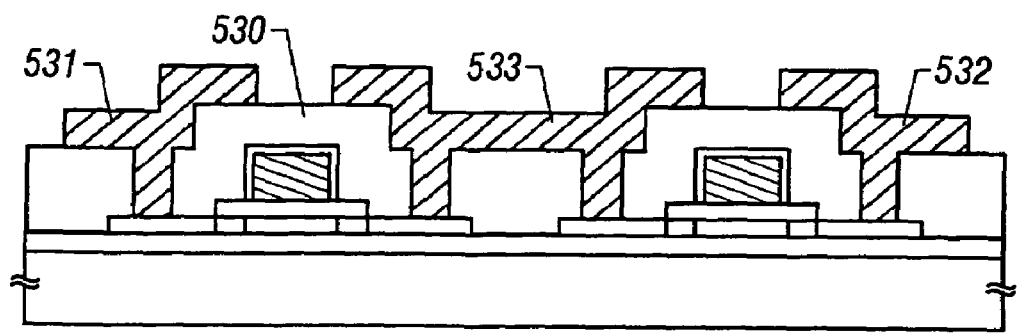

Through the above steps, the CMOS circuit of the structure shown in FIG. 6C can be formed. The CMOS circuit is an inverter circuit having the simplest structure. A closed circuit formed by connecting an odd number of CMOS inverter circuits in series is called a ring oscillator, which is used when the operation speed of a semiconductor device is evaluated.

Figure 7A:
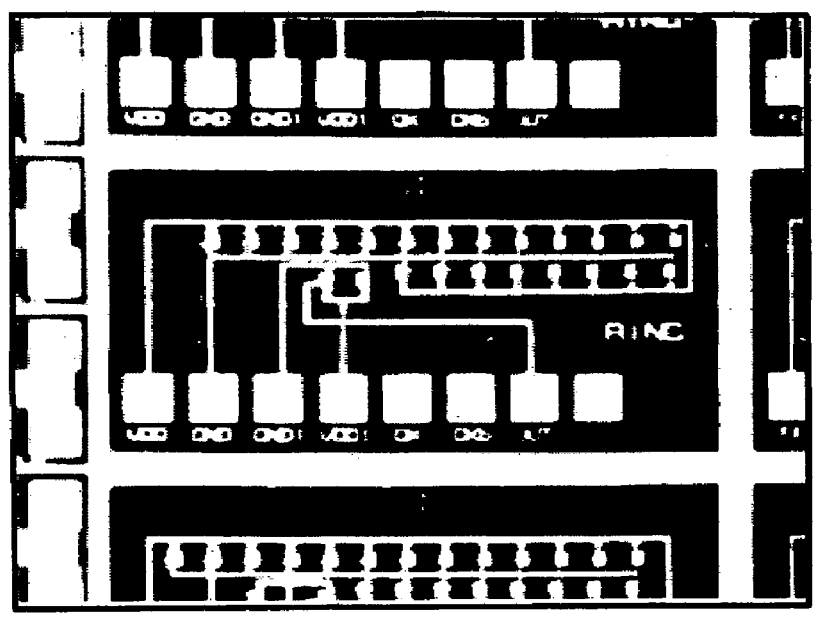
FIGS. 7A and 7B are photographs showing the structure of an electric circuit.

Here, an upside photograph shown in FIG. 7A is a ring oscillator circuit constituted by combination of CMOS circuits manufactured in accordance with this embodiment. The present inventors actually formed an active matrix type liquid crystal display device using the present invention, and confirmed the operation performance of its drive circuit by the ring oscillator.

A width of a gate electrode of the CMOS circuit constituting the ring oscillator shown in FIG. 7A is thin and is about 0.6 μm, and the channel formation region is made so minute that a short channel effect usually occurs.

Figure 7B:
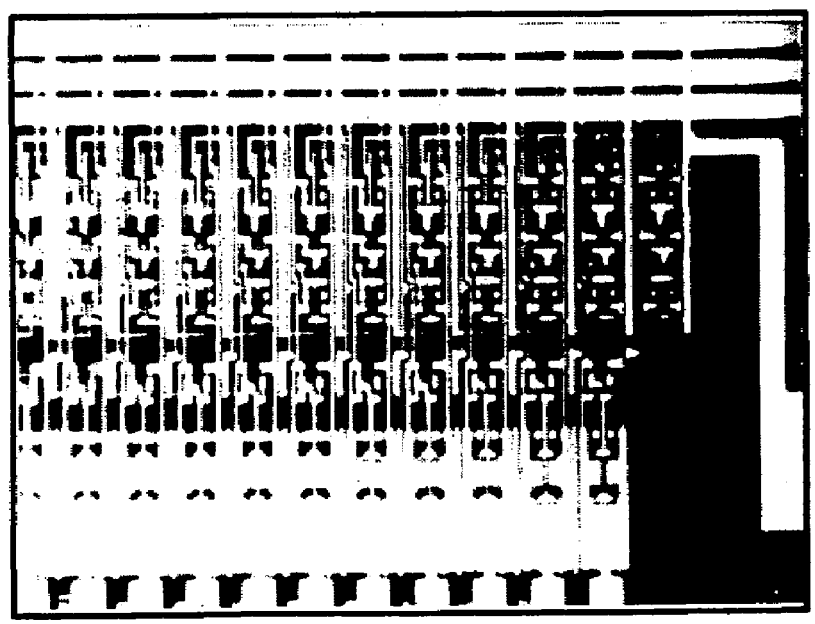

FIG. 7B is a photograph of a shift resistor for reference. The shift resister circuit shown in FIG. 7B is one of important circuits constituting an experimentally manufactured peripheral drive circuit, and is a logic circuit for specifying an address of a pixel region. Especially, a shift resister circuit for horizontal scanning (source side use) is required driving at very high frequency of about several MHz to several tens MHz at a real operation.

The oscillation frequency of the ring oscillator was measured by the ring oscillator in which nine, nineteen, and fifty one groups (steps) of CMOS circuits are connected. As a result, in the ring oscillator of nine stages at a power source voltage of 3 to 5V, oscillation frequencies of more than 300 MHz, or over 500 MHz in some oscillators were obtained. Thus, it is found that the operation speed is extremely high.

These values mean that the operation speed is near 20 times higher than the ring oscillator formed by conventional manufacturing steps. Even if the power source voltage is changed in the range of 1 to 5V, the oscillation frequencies of several tens to several hundred MHz are always realized.

As described above, the CMOS circuit using the present invention can be operated at high speed without any problem even in the state where additional values are forcibly added in view of circuit design, and has performance to satisfy all logic circuits.

Further, although the channel length is made 0.6 μm which is extremely thin, the CMOS circuit has such very high withstand voltage characteristics as to withstand extremely high speed operation as shown in this embodiment, which means that the TFT of the present invention is hardly influenced by the short channel effect and has very high reliability.

[Inference Derived by the Structure of the Present Invention]

As shown in the first embodiment and the second embodiment, the TFT formed in accordance with the present invention has extremely high performance (high speed operation characteristics, high withstand voltage characteristics). The feature that the TFT has high resistance against deterioration though it has such high speed operation characteristics, is empirically said to be a peculiar phenomenon. The present inventors considered why the TFT of the present invention was so superior in deterioration resistance, and inferred a theory, which will be described below.

The present inventors attached importance to the effect of crystal grain boundaries of needle-shaped or column-shaped crystals as reason why the withstand voltage of the TFT of the present invention is high. That is, the present inventors inferred that the crystal grain boundaries (expected to be oxide regions) existing locally in the channel formation region effectively relieve high electric field applied between the source region and the drain region, especially between the channel formation region and the drain region.

Concretely, the inventors considered that the crystal grain boundaries especially suppress an electric field formed by a depletion layer charge and extending from the drain region, and they serve not to change a diffusion voltage at the source side even in the state where the drain voltage become high (state where the drain side depletion layer charge is increased).

In summary, in the case where the crystalline silicon film of the present invention is used as an active layer, it is conceivable that the channel formation region satisfies the following structures.

(1) There is a substantially intrinsic (for carriers) region (inside of needle-shaped or column-shaped crystals) in which carriers move.

(2) There is an energy barrier to suppress the movement of carriers or to relieve an electric field applied in a channel direction (direction connecting source and drain).

Accordingly, it is conceivable that the TFT having superior characteristics as shown in the present invention can be manufactured by satisfying the above two structures, in other words, by making the structure having the channel formation region which is substantially intrinsic for carriers, and the locally formed energy barrier.

The above structures are derived from experimental data of the present inventors though some assumption is added. Then, the inventors expected that if the structures are artificially formed, similar effects can be obtained.

As a result, the inventors came to propose the effective structure to suppress the short channel effect. The brief description will be given here. However, the consideration set forth below is merely within inference in the present circumstances.

The short channel effect is a generic term referring to lowering of a threshold voltage, deterioration of a withstand voltage with a punch-through phenomenon, deterioration of subthreshold characteristics and the like. The especially problematic punch-through phenomenon is a phenomenon in which a depletion layer at a drain side extends to a source region, so that a diffusion voltage at a source side is lowered, and a through current flows between the source and drain.

Then, the present inventors paid attention to the effect of crystal grain boundaries of the present invention, and inferred that in the short channel TFT having a channel length of about 0.01 to 2 μm, the effect to suppress the extension of depletion layer at the drain side can be obtained by providing impurity region artificially and locally into the channel formation region.

Figure 8A:
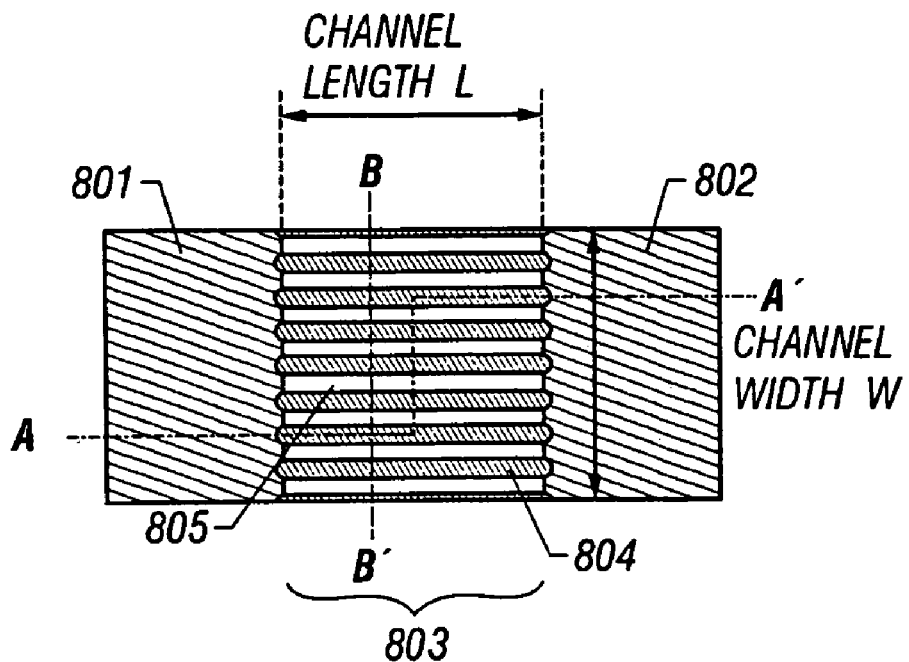
FIGS. 8A to 8C are views showing the structure of an active layer.

It is conceivable that such a structure can be obtained by making an active layer have a structure as shown in FIG. 8. In FIG. 8A, 801 denotes a source region, 802 denotes a drain region, and 803 denotes a channel formation region. An impurity region 804 is artificially formed in the channel formation region 803. In the channel formation region 803, a region 805 other than the impurity region 804 is a substantially intrinsic region where carriers move.

Here, it is important that the structure shown in FIG. 8A is a structure similar to the crystalline structure body of the present invention shown in FIG. 10. That is, the crystal grain boundary designated by 1001 in FIG. 10 corresponds to impurity region 804 in FIG. 8A, and the needle-shaped or column-shaped crystal shown in FIG. 10 corresponds to the region 805 shown in FIG. 8A where carries move.

Accordingly, it is inferred that the impurity region 804 arranged in the channel formation region 803 forms locally a region where a built-in potential (also called energy barrier) is high, in the channel formation region, and the extension of drain side depletion layer is effectively suppressed by the energy barrier.

Figure 8B:
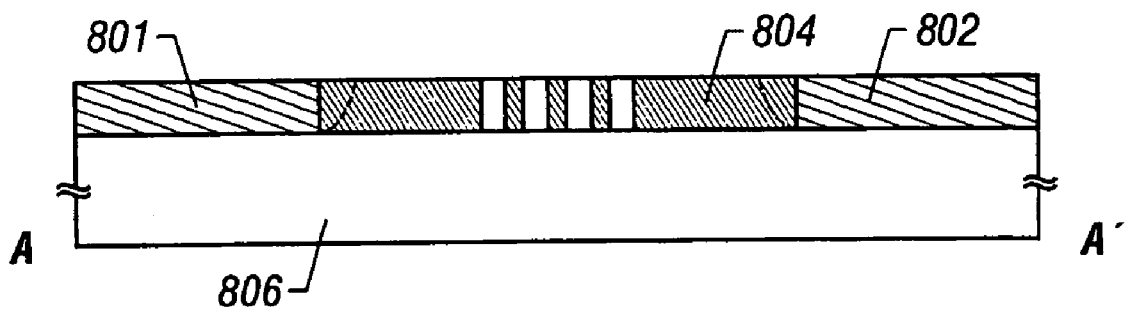
Figure 8C:
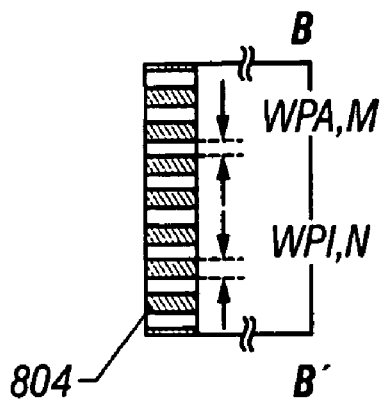
Figure 9:
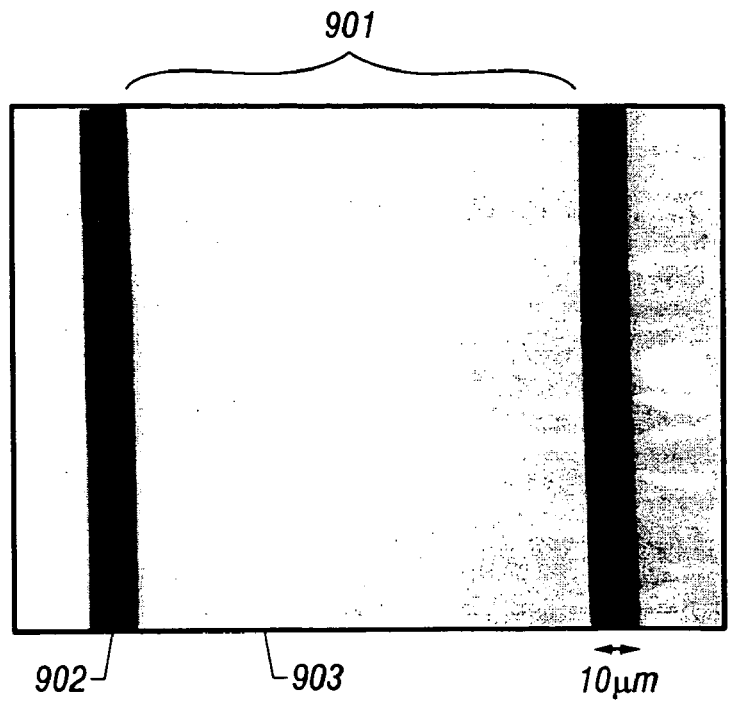
FIG. 9 is a photograph showing the surface of a crystalline silicon film.

FIG. 8B is a sectional view taken along A–A' of FIG. 8A. 806 denotes a substrate having an insulating surface. FIG. 8C is a sectional view taken along B–B' of FIG. 8A.

In FIG. 8C, Wpi,n denotes a width of the impurity region 804, and Wpa,m denotes a width of a region where carriers move. Here, n and m mean that in the channel formation region 803, Wpi,n is a width of an n-th impurity region, and Wpa,m is a m-th region where carriers move.

Accordingly, the practical field effect mobility of the TFT of the present invention is obtained by substituting an effective channel width Wpa (total of Wpa,m from 1 to m) into a theoretical equation expressed below.

$$\mu FE = 1/\text{Cox}(\Delta Id/\Delta Vg) \cdot 1/Vd \cdot L/W$$

Here, Cox is a capacitance of a gate oxidation film, $\Delta Id$ and $\Delta Vg$ are respectively an amount of change of drain current Id and gate voltage Vg, Vd is a drain voltage, and L and W are respectively a channel length and a channel width.

However, since it is practically impossible to measure the effective channel width Wpa, the field effect mobility in the present specification is obtained by substituting a design value W of the channel width. That is, it is conceivable that a value smaller than a real mobility is obtained.

It is expected that providing the impurity regions in the arrangement as shown in FIG. 8A has an extremely magnificent meaning in the improvement of mobility. The reason will be described below.

The mobility (μFE) is determined by scattering of carriers in the semiconductor film (here, silicon film is used as an example), and the scattering in the silicon film is roughly divided into lattice scattering and impurity scattering. The total mobility μ formed by the combination thereof is expressed by the following equation.

$$\mu = (1/\mu_l + 1/\mu_i)^{-1} \quad (1)$$

The equation (1) means that the total mobility μ is in reverse proportion to the sum of an inverse number of mobility l (l means lattice) in the case where the influence of lattice scattering is exerted, and an inverse number of mobility i (i means impurity) in the case where the influence of impurity scattering is exerted. The lattice scattering and the impurity scattering are expressed by the following equations, respectively.

$$\mu l \propto (m^*)^{-5/2} T^{-3/2} \quad (2)$$

$$\mu i \propto (m^*)^{-1/2} Ni^{-1} T^{3/2} \quad (3)$$

According to these equations, in the state where impurities are uniformly added into the entire of the channel formation region, the mobility can not be improved due to the influence of impurity scattering. However, in the case of the structure shown in FIG. 12, since impurity regions are locally formed, impurities are not added into the regions where carriers move, so that the regions are substantially intrinsic for the carriers.

That is, since it theoretically means that the concentration Ni of ionized impurities in equation (3) is made to approach to zero without limit, the mobility μi approaches to the infinity without limit. That is, since it means that the impurities are decreased so that the term $1/\mu_i$ in equation (1) can be neglected, it is inferred that the total mobility approaches to the mobility μl without limit.

Also, in FIG. 8A, it is important that the impurity region 804 is arranged so as to be substantially parallel to the channel direction. Such arrangement corresponds to the case where the direction of extension of the needle-shaped or column-shaped crystals shown in FIG. 10 coincides with the channel direction.

In the case of such arrangement, since it is expected that the impurity region 804 serves as "benign crystal grain boundary", it is inferred that the region serves as a rail to regulate the moving direction of carriers without capturing the carriers. This is a very important structure in view of decreasing the influence of scattering due to collision of carriers.

Also, by providing the above structure, it is expected that the lowering of threshold voltage as one of the short channel effect can be suppressed. This is an expectation based on the inference that it is possible to artificially cause a narrow channel effect generated at the time when the channel width becomes extremely narrow, between the impurity regions.

As described above, it is conceivable that the punch-through phenomenon can be suppressed by repressing the extension of drain side depletion layer. By suppressing the punch-through phenomenon, it is expected to obtain not only the improvement of withstand voltage but also the improvement of subthreshold characteristics (S-value).

The improvement of the subthreshold characteristics can be explained as follows, from the inference that the volume occupied by the drain side depletion layer can be decreased by using the present structure.

When the structure shown in FIG. 8A is provided, if the extension of depletion layer can be effectively suppressed, it should be possible to decrease the volume occupied by the drain side depletion layer to a large degree. Accordingly, since the total charge of depletion layer can be made small, it is conceivable that the depletion capacitance can be made small. Here, an equation for deriving the S-value is expressed by the following approximate equation.

$$S \approx \ln 10 \cdot kT/q[1+(Cd+Cit)/Cox] \qquad (4)$$

In equation (4), k is Boltzmann constant, T is an absolute temperature, q is a charge quantity, Cd is a capacitance of depletion layer, Cit is an equivalent capacitance of interface levels, and Cox is a capacitance of a gate oxide film. Accordingly, in this structure, if the capacitance Cd of the depletion layer and the equivalent capacitance Cit of the interface levels are made to approach to zero to the greatest possible extent, there is a possibility that a semiconductor device in which an ideal state of Cd=Cit=0 is realized, that is, the S-value is 60 mV/decade, can be realized.

However, equation (4) is an approximate equation for deriving the S-value, and there is a case in a TFT, where measurement values of not larger than 60 mV/decade are obtained without following this approximate equation.

In this structure inferred from the present invention, as an impurity region equivalent to the crystal grain boundary of the present invention, nitrogen or carbon may be used other than oxygen. This is because the object of this structure is to artificially dispose an energy barrier to the channel formation region.

Accordingly, in view of formation of energy barrier, it can be said that even an impurity region having conductivity opposite to the conductivity of an inversion layer has an effect. That is, it can be said that the impurity region is formed by using B ions for an N-channel type semiconductor device, and P ions for a P-channel type semiconductor device.

In the case where the impurity region is formed by P or B ions, it is possible to directly control the threshold value by the concentration of added impurity ions.

As described above, this structure is a technique derived from the inference of the present inventors based on the structure of the invention disclosed in the present specification and experimental facts. By practicing this structure, it is inferred that it is possible to effectively suppress the short channel effect which becomes a problem in a semiconductor device of a deep submicron region in which a channel length is extremely short.

[Third Embodiment]

This embodiment shows other manufacturing steps than those shown in the first embodiment. Specifically, prior to the formation of an active layer, a heat treatment in an atmosphere containing a halogen element is carried out to a crystalline silicon film to remove nickel through gettering.

By combining the step shown in this embodiment with the first embodiment, it is possible to further effectively decrease the nickel concentration in the active layer.

By the heat treatment over 700° C., the film thickness of the crystalline silicon film is decreased, so that this embodiment has also an effect to thin the active layer. If the film thickness becomes thin, it is expected that the mobility is improved and off-state current is decreased.

[Fourth Embodiment]

This embodiment shows other manufacturing steps than those shown in the first embodiment. Specifically, the step of forming the gate insulating film 111 in the first embodiment, is omitted, and immediately after the formation of the active layer, a heat treatment in an atmosphere containing a halogen element is carried out.

If annealing to a thermal oxidation film formed at this time is carried out in a nitrogen atmosphere as in the first embodiment, the film quality can be improved. In this case, it is possible to form the gate insulating film by only such thermal oxidation film. The film thickness of the thermal oxidation film can be adjusted between 100 to 1500 Å (typically 500 to 1000 Å) by controlling the condition of the heat treatment.

If the gate insulating film is formed of only the thermal oxidation film, there are obtained such features that a semiconductor device capable of operating at high speed can be obtained, and film formation steps of the gate insulating film can be simplified. However, it is frequently difficult to make film thickness uniform.

It is also possible to deposit an insulating film by a vapor phase method on the thermal oxidation film formed by the above step, and to form the gate insulating film by those laminating films. In this case, although the gate withstand voltage is improved, it is important to make clean the interface between the thermal oxidation film and the film by the vapor phase method.

It is also possible that the above step is assumed to be a step of removing a metal element (especially nickel), so that the thermal oxidation film formed by the above step is removed, and a thermal oxidation film is again formed to make the gate insulating film. Further, it is also possible that after the thermal oxidation film is removed, a gate insulating film is formed on the active layer by a vapor phase method. In this case, although it is possible to decrease the concentration of surplus impurities existing in the interface between the active layer and the gate insulating film, care must be paid to the cleanness of the surface of the active layer.

[Fifth Embodiment]

This embodiment shows examples in which TFTs manufactured-by applying the present invention are applied to a DRAM (Dynamic Random Access Memory) and an SRAM (Static Random Access Memory). FIG. 13 will be used for the description of this embodiment.

The DRAM is a memory of a type in which information to be memorized is stored as charges in a capacitor. The input and output of charges as information to the capacitor is controlled by Fits connected in series to the capacitor.

Figure 13A:
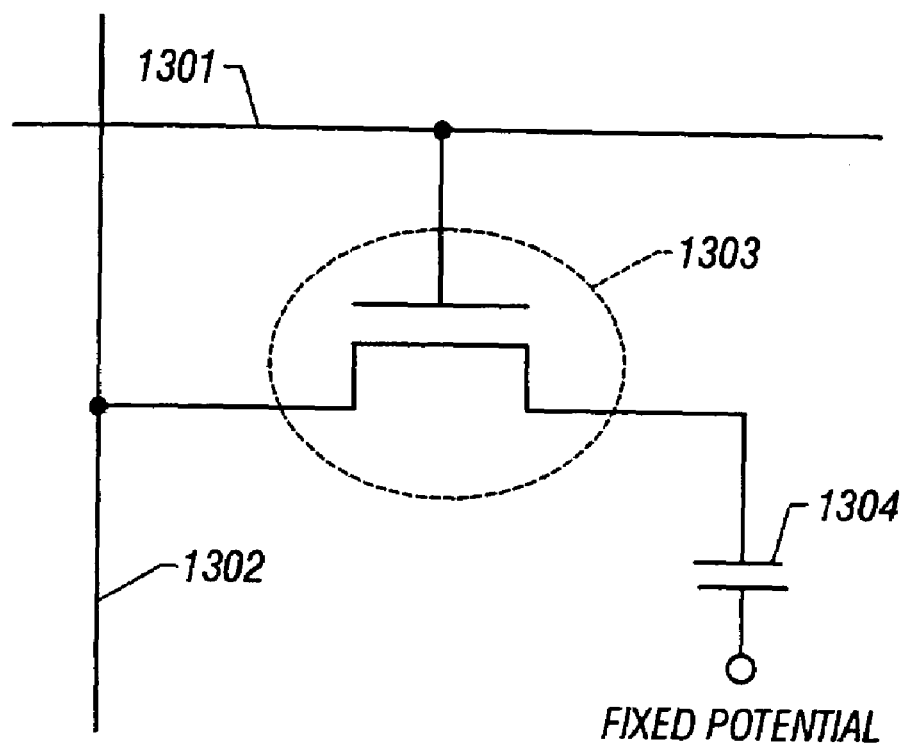
FIGS. 13A and 13B are views showing the structure of a DRAM and an SRAM.

FIG. 13A shows a circuit of a TFT and a capacitor constituting one memory cell of the DRAM.

When a gate signal is given by a word line 1301, a TFT 1303 is turned on. In this state, charges are transferred from the side of a bit line 1302 to a capacitor 1304 to write information, or charges are taken from the charged capacitor to read information. That is, by writing and reading charges stored in the capacitor through the TFT, the circuit has the function as a memory cell.

The DRAM has such a feature that the number of components constituting one memory cell is very small since only a TFT and a capacitor constitute one memory cell, so that it is suitable for constituting a large scale memory of high integration density. Further, since the cost can be kept low, the DRAM is used in largest quantities at present.

Further, a feature of the case where a DRAM cell is formed by using the TFTs, is that since the storage capacitance is made small, the operation at a low voltage is made possible.

Figure 13B:
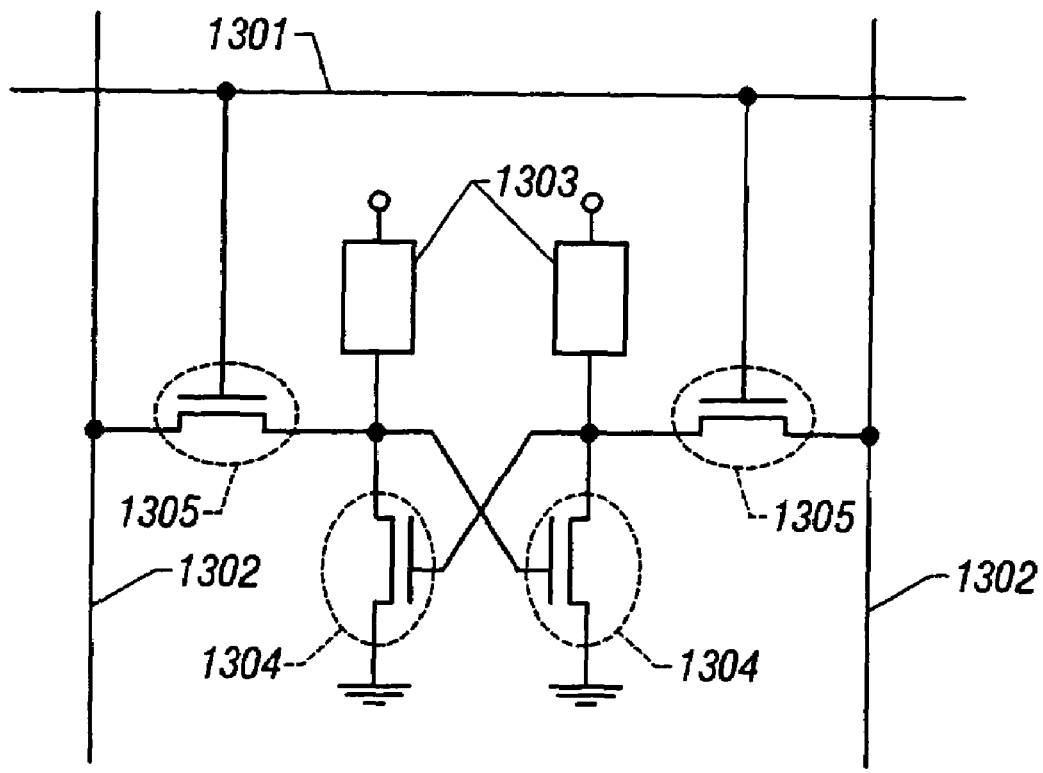

FIG. 13B shows an SRAM circuit using a high resistance as a passive load element. It is also possible to make an SRAM structure in which a TFT performs the same function as the passive load element.

The SRAM is a memory using a bistable circuit such as a flip-flop as a memory cell, and stores a binary information value (0 or 1) corresponding to two stable states of ON-OFF or OFF-ON of the bistable circuit. It is advantageous in that the memory is held as long as power supplied.

Reference numeral 1305 denotes a word line, and 1306 denotes a bit line. 1307 denotes load elements constituted by high resistances, and the SRAM is constituted by two pairs of driver transistors 1308 and two pairs of access transistors 1309.

The SRAM of the above structure has such features that high speed operation is possible, reliability is high, and assembling into a system is easy.

[Sixth Embodiment]

This embodiment shows an active matrix type electro-optical device in which a pixel matrix circuit and a logic circuit are integrated on the same substrate by using the semiconductor devices of the first embodiment and the CMOS circuits of the second embodiment. The electro-optical device includes a liquid crystal display device, an EL display device, an EC display device and the like.

The logic circuit indicates an integrated circuit for driving an electro-optical device, such as a peripheral drive circuit or a control circuit. In the active matrix type electro-optical device, in view of the limit of operation performance and problem of integration, a logic circuit has been generally an externally equipped IC. However, by using the TFT of the present invention, it becomes possible to integrate all elements on the same substrate.

The control circuit includes all electric circuits necessary for driving of an electro-optical device, such as a processor circuit, a memory circuit, a clock generation circuit, and an A/D (D/A) converter circuit. Of course, the memory circuit includes the SRAM circuit and the DRAM circuit shown in the fifth and sixth embodiments.

If the present invention is used for such a structure, it is possible to constitute a logic circuit by TFTs having performance comparable to MOSFETs formed on a single crystal.

[Seventh Embodiment]

This embodiment shows an example of manufacture of a TFT having a structure different from the first embodiment. FIG. 14 will be used for the description.

Figure 14A:
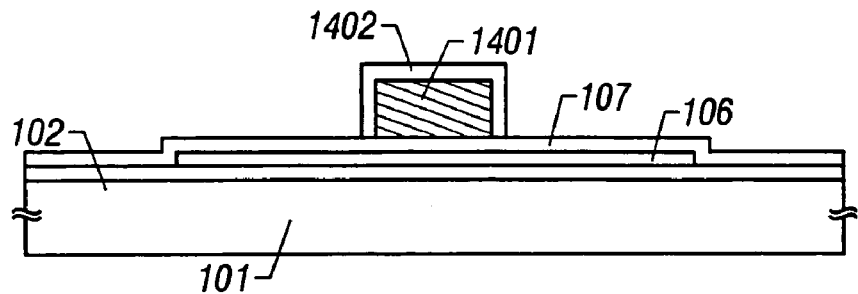
FIGS. 14A to 14D are views showing manufacturing steps of a semiconductor device.

First, the state shown in FIG. 2B is obtained through the same steps as the first embodiment. After the state shown in FIG. 2B is obtained, a not-shown resist mask used for patterning an aluminum film is removed, and then anodic oxidation is carried out in tartaric acid so that a dense anodic oxidation film with a thickness of 1000 Å is obtained. FIG. 14A shows this state.

In FIG. 14A, reference numeral 101 denotes a quartz substrate, 102 denotes an under film, 106 denotes an active layer, and 107 denotes a thermal oxidation film subsequently functioning as a gate insulating film. Reference numeral 1401 denotes a gate electrode made of a material containing mainly aluminum, 1402 denotes a dense anodic oxidation film obtained by anodic oxidation of the gate electrode 1401.

Next, in this state, impurity ions to impart one conductivity are implanted into the active layer 106. This ion implantation step forms impurity regions 1403 and 1404.

After the impurity ion implantation is completed, a silicon nitride film 1405 with a thickness of 0.5 to 1 μm is formed. Any of a low pressure thermal CVD method, a plasma CVD method, and a sputtering method may be used as a film growth method. A silicon oxide film may be used instead of the silicon nitride film.

Figure 14B:
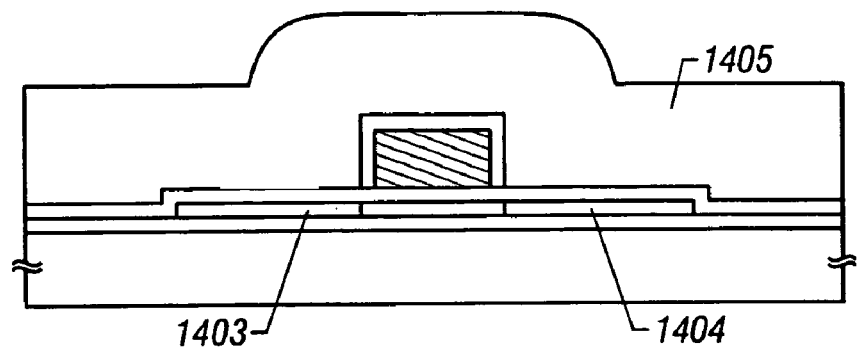

In this way, the state shown in FIG. 14B is obtained. After the state shown in FIG. 14B is obtained, the silicon nitride film 1405 is next etched by an etch back method, so that the silicon nitride film is made to remain only at a side wall of the gate electrode 1401. The thus left silicon nitride film functions as a side wall 1406.

Figure 14C:
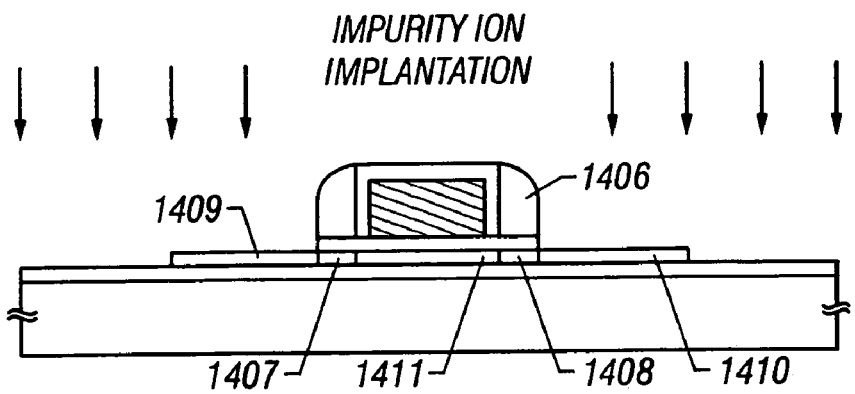

At this time, the thermal oxidation film 107 is removed except the region where the gate electrode serves as a mask, so that the thermal oxidation film remains in the state as shown in FIG. 14C.

In the state shown in FIG. 14C, impurity ions are again implanted. At this time, a dose is made higher than that at the previous ion implantation. At this ion implantation, since ion implantation is not carried out to regions 1407 and 1408 immediately below the side wall 1406, the concentration of impurity ions is not changed. However, higher concentration impurity ions are implanted into exposed regions 1409 and 1410.

In this way, through the second ion implantation, a source region 1409, a drain region 1410, and low concentration impurity regions (LDD regions) 1407 and 1408 having impurity concentration lower than the source/drain regions are formed. The region immediately below the gate electrode 1401 is an undoped region and becomes a channel formation region 1411.

Figure 14D:
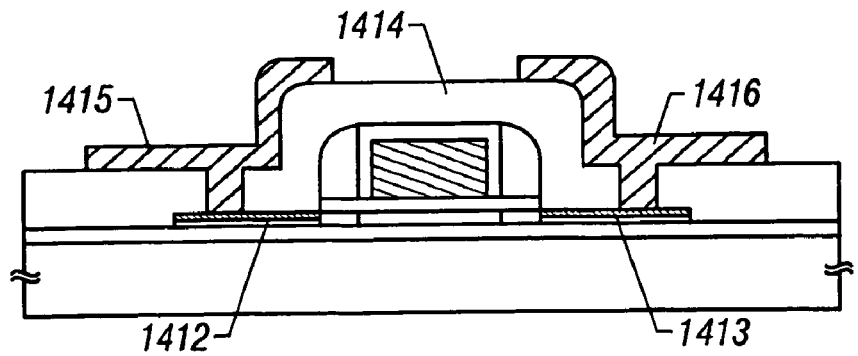

After the state shown in FIG. 14C is obtained through the above steps, a not-shown titanium film with a thickness of 300 Å is formed, and the titanium film and silicon (crystalline silicon) film are made to react with each other. After the titanium film is removed, a heat treatment by lamp annealing or the like is carried out so that titanium silicide 1412 and 1413 are formed on the surfaces of the source region 1409 and the drain region 1410 (FIG. 14D).

A tantalum film, a tungsten film, a molybdenum film or the like may be used in the above step instead of the titanium film.

Next, as an interlayer insulating film 1414, a silicon oxide film with a thickness of 5000 Å is formed, and a source electrode 1415 and a drain electrode 1416 are formed. In this way, a TFT having the structure shown in FIG. 14D is completed.

In the TFT having the structure of this embodiment, since the source/drain electrodes are connected to the source/drain regions through the titanium silicide 1412 and 1413, superior ohmic contact can be realized.

[Eighth Embodiment]

This embodiment shows an example of manufacture of a TFT having a structure different from the first or seventh embodiment. FIG. 15 will be used for the description.

Figure 15A:
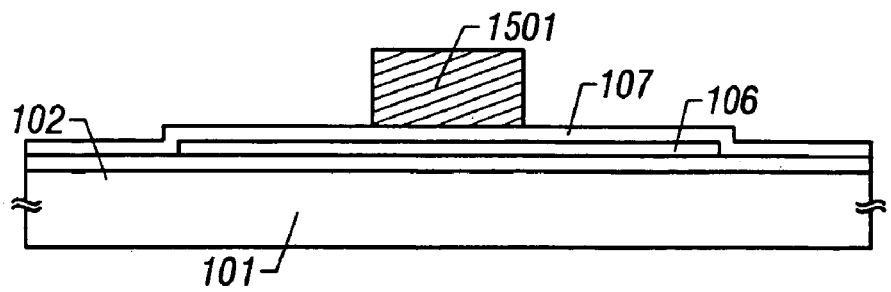
FIGS. 15A to 15D are views showing manufacturing steps of a semiconductor device.

First, the state shown in FIG. 2B is obtained through the steps similar to the first embodiment. However, in this embodiment, a conductive crystalline silicon film is used as a material of a gate electrode. FIG. 15A shows this states.

In FIG. 15A, 101 denotes a quartz substrate, 102 denotes an under film, 106 denotes an active layer, and 107 denotes a thermal oxidation film subsequently functioning as a gate insulating film. 1501 denotes a gate electrode made of a crystalline silicon film (polysilicon film).

Figure 15B:
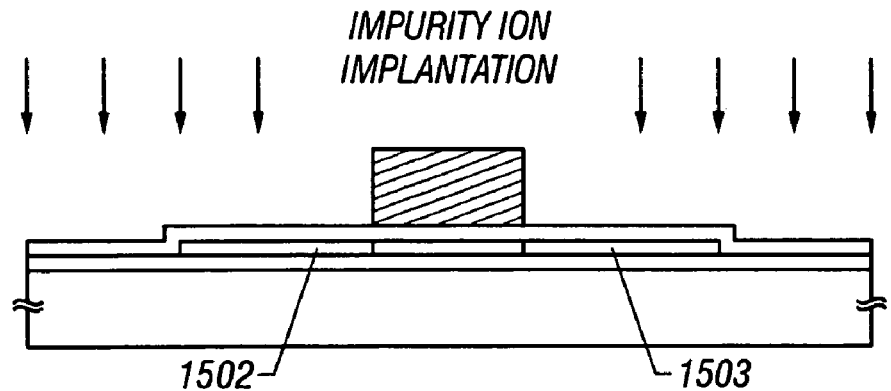

Next, impurity ions for imparting one conductivity are implanted into the active layer 106. This ion implantation step forms impurity regions 1502 and 1503 (FIG. 15B).

After the impurity ion implantation is completed, a side wall 1504 is formed by using an etch back method similarly to the seventh embodiment.

After the side wall 1504 is formed, impurity ions are again implanted. After the above double ion implantation, a source region 1507, a drain region 1508, low concentration impurity regions (LDD regions) 1505 and 1506, and a channel formation region 1509 are formed.

Figure 15C:
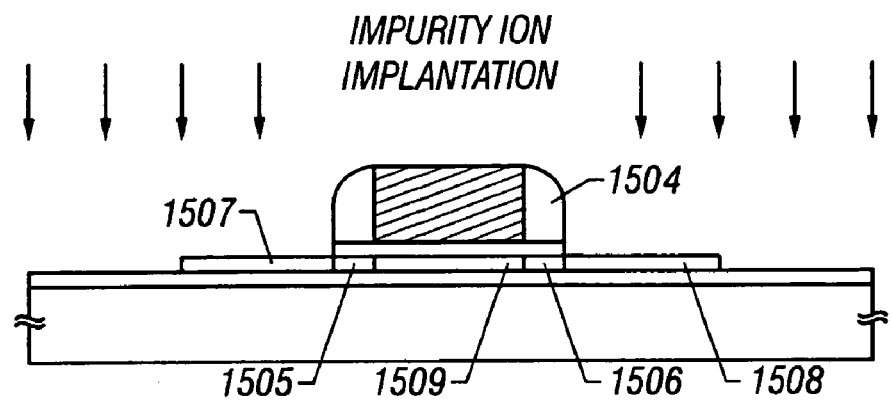
Figure 15D:
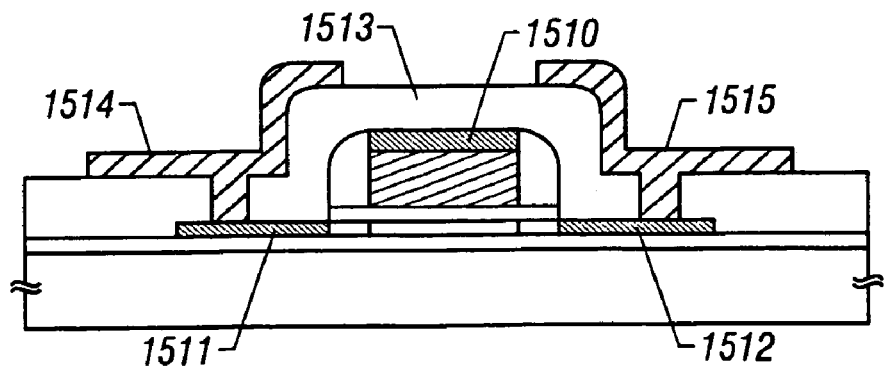

After the state shown in FIG. 15C is obtained through the above steps, a not-shown tungsten film with a thickness of 500 Å is formed, and tungsten film and silicon film are made to react with each other. Then, after the tungsten film is removed, a heat treatment such as lamp annealing is carried out so that tungsten silicide 1510 to 1512 are formed on the surfaces of the gate electrode 1501, source region 1507 and drain region 1508 (FIG. 15D).

Next, as an interlayer insulating film 1513, a silicon nitride film with a thickness of 4000 Å is formed, and a source electrode 1514 and a drain electrode 1515 are formed. In this way, the TFT having the structure shown in FIG. 15D is completed.

In the TFT having the structure shown in this embodiment, the gate electrode and source/drain electrodes are connected to lead electrodes through the tungsten silicide 1510 to 1512, so that excellent ohmic contact can be realized.

[Ninth Embodiment]

In this embodiment, examples of electro-optical devices (display devices) incorporating semiconductor devices using the present invention will be described. The electro-optical device may be used as a direct view type or a projection type according to necessity. Since it is conceivable that the electro-optical device is a device functioning by using a semiconductor, the electro-optical device in the present specification is assumed to be included in a category of semiconductor devices.

Applied products of semiconductor devices using she present invention include a TV camera, a head mount display, a car navigation unit, a projector (front type or rear type), a video camera, a personal computer and the like. Simple examples of those applied products will be described with reference to FIG. 16.

FIG. 16A shows a TV camera which is constituted by a main body 2001, a camera portion 2002, a display device 2003, and an operation switch 2004. The display device 2003 is used as a view finder.

FIG. 16B shows a head mount display which is constituted by a main body 2101, a display device 2102, and a band portion 2103. As the display device 2102, two units of relatively small size are used.

FIG. 16C shows a car navigation unit which is constituted by a main body 2201, a display device 2202, an operation switch 2203, and an antenna 2204. Although the display device 2202 is used as a monitor, an allowable range of resolution is relatively wide since display of a map is a main object.

FIG. 16D shows a portable information terminal (portable telephone in this embodiment) which is constituted by a main body 2301, a sound output portion 2302, a sound input portion 2303, a display device 2304, operation buttons 2305, and an antenna 2306. It is expected that the display device 2304 is required to display moving pictures for a TV telephone in future.

FIG. 16E shows a video camera which is constituted by a main body 2401, a display device 2402, an eyepiece portion 2403, an operation switch 2404, and a tape holder 2405. Since picture images displayed on the display device 2402 can be seen in real time through the eyepiece portion 2403, a user can take pictures while seeing the picture images.

FIG. 16F shows a front projector which is constituted by a main body 2501, a light source 2502, a reflection type display device 2503, an optical system (including a beam splitter, polarizer and the like) 2504, and a screen 2505. Since the screen 2505 is a large screen used for presentation at a meeting or announcement at an academic society, high resolution is required for the display device 2503.

Other than the electro-optical devices shown in this embodiment, the invention can be applied to a rear projector, and a portable information terminal such as a mobile computer and a handy terminal. As described above, the scope of application of the present invention is extremely wide, and the invention can be applied to display media of all fields.

Further, the TFTs of the invention are not limited to the electro-optical devices, but may be incorporated into integrated circuits in the form of, for example, the SRAM and DRAM and may be used as drive circuits of applied products shown in this embodiment.

As described above, according to the present invention, a TFT having performance comparable to a MOSFET formed on a single crystal can be realized. A ring oscillator constituted by TFTs of the present invention can operate at speed 20 times higher than a ring oscillator constituted by conventional TFTs. Further, although the TFT of the invention has such high performance, it has extremely high withstand voltage characteristics even in a minute region in which a channel length is not larger than 1 μm, and it is confirmed that the short channel effect is effectively suppressed.

If an integrated circuit constituted by using the above TFTs is applied to an electro-optical device, the electro-optical device can be made to have higher performance. Further, applied products using the electro-optical devices can also be made to have high performance and high additional values.

What is claimed is:

1. A camera comprising:
   a main body;
   a camera portion incorporated into the main body; and
   a display device having thin film transistors incorporated into the main body,
   wherein each of the thin film transistors comprises:
   a semiconductor layer formed over a substrate, the semiconductor layer having source and drain regions and a channel formation region interposed therebetween; and
   a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a standard deviation of S-value of the thin film transistor is within 10 mV/dec for a N-channel type and 15 mV/dec for a P-channel type.

2. A camera comprising:

a main body;

a camera portion incorporated into the main body; and a display device having thin film transistors incorporated into the main body, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a length of the channel formation region is 0.1 to 2 μm.

3. A navigation unit comprising:

a main body;

an operation switch incorporated into the main body; and a display device having thin film transistors incorporated into the main body, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a standard deviation of S-value of the thin film transistor is within 10 mV/dec for a N-channel type and 15 mV/dec for a P-channel type.

4. A navigation unit comprising:

a main body;

an operation switch incorporated into the main body; and a display device having thin film transistors incorporated into the main body, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a length of the channel formation region is 0.1 to 2 μm.

5. A portable information terminal comprising:

a main body;

an operation button incorporated into the main body;

an antenna incorporated into the main body; and a display device having thin film transistors incorporated into the main body, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a standard deviation of S-value of the thin film transistor is within 10 mV/dec for a N-channel type and 15 mV/dec for a P-channel type.

6. The portable information terminal according to claim 5 wherein the portable information terminal is a portable phone.

7. A portable information terminal comprising:

a main body;

an operation button incorporated into the main body;

an antenna incorporated into the main body; and a display device having thin film transistors incorporated into the main body, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a length of the channel formation region is 0.1 to 2 μm.

8. The portable information terminal according to claim 7 wherein the portable information terminal is a portable phone.

9. A projector comprising:

a main body;

a light source incorporated into the main body;

a display device having thin film transistors incorporated into the main body;

a optical system; and a screen, wherein each of the thin film transistors comprises:

a semiconductor layer formed over a substrate, the semiconductor layer having source and drain regions and a channel formation region interposed therebetween; and a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a standard deviation of S-value of the thin film transistor is within 10 mV/dec for a N-channel type and 15 mV/dec for a P-channel type.

10. A projector comprising:

a main body;

a light source incorporated into the main body;

a display device having thin film transistors incorporated into the main body;

a optical system ; and
a screen,
wherein each of the thin film transistors comprises:
a semiconductor layer formed over a substrate, the semiconductor layer having source and drain regions and a channel formation region interposed therebetween; and
a gate electrode formed adjacent to the semiconductor layer with a gate insulating film interposed therebetween, wherein the semiconductor layer comprises needle-shaped or column-shaped crystals which are substantially aligned in a direction parallel to a length direction of the channel formation region, wherein a length of the channel formation region is 0.1 to 2 μm.

* * * * *